(12) United States Patent
Matthews et al.

(10) Patent No.: US 9,722,646 B1
(45) Date of Patent: Aug. 1, 2017

(54) INTEGRATIVE SOFTWARE RADIO FREQUENCY MANAGEMENT SYSTEM AND METHOD FOR COMPENSATION OF NONLINEAR RESPONSE IN RADIO FREQUENCY DEVICES

(71) Applicant: Physical Optics Corporation, Torrance, CA (US)

(72) Inventors: John Matthews, Torrance, CA (US); Leonid Bukshpun, Encino, CA (US); Tomasz Jannson, Torrance, CA (US); Andrew Kostrzewski, Garden Grove, CA (US); Ranjit Pradhan, Torrance, CA (US)

(73) Assignee: Physical Optics Corporation, Torrance, CA (US)

( * ) Notice: Subject to any disclaimer, the term of this patent is extended or adjusted under 35 U.S.C. 154(b) by 0 days.

(21) Appl. No.: 14/875,482

(22) Filed: Oct. 5, 2015

Related U.S. Application Data

(60) Provisional application No. 62/098,913, filed on Dec. 31, 2014, provisional application No. 62/219,304, filed on Sep. 16, 2015, provisional application No. 62/102,994, filed on Jan. 13, 2015.

(51) Int. Cl.
*H04B 1/04* (2006.01)
*H03F 1/02* (2006.01)
*H03F 1/42* (2006.01)
*H03F 3/19* (2006.01)

(52) U.S. Cl.
CPC ......... *H04B 1/0475* (2013.01); *H03F 1/0205* (2013.01); *H03F 1/42* (2013.01); *H03F 3/19* (2013.01); *H03F 2200/451* (2013.01); *H04B 2001/0425* (2013.01)

(58) Field of Classification Search
CPC .... H03F 3/187; H03F 3/45928; H04B 1/0475
USPC ....................................................... 375/297
See application file for complete search history.

(56) References Cited

U.S. PATENT DOCUMENTS

| | | | | |
|---|---|---|---|---|
| 5,867,065 A | * | 2/1999 | Leyendecker | ........ H03F 1/3247 330/149 |
| 2008/0012638 A1 | * | 1/2008 | Funaki | .................. H03F 1/0205 330/136 |
| 2010/0119012 A1 | * | 5/2010 | Pal | ........................ H04B 1/0039 375/324 |
| 2014/0313946 A1 | * | 10/2014 | Azadet | ................ G06F 17/5009 370/278 |

\* cited by examiner

*Primary Examiner* — Michael Neff
(74) *Attorney, Agent, or Firm* — Sheppard, Mullin, Richter & Hampton LLP; Daniel Yannuzzi

(57) ABSTRACT

A RF communication system includes a radio transmitter comprising an RF power amplifier, the RF power amplifier including an input to receive an RF signal for transmission and being configured to amplify the RF signal for transmission across a communication channel; a RF digital pre- or post-distortion configured to compensate for nonlinearity of the RF communication system by operating on the RF signal entering or exiting the amplifier.

38 Claims, 23 Drawing Sheets

PROBLEM: Friendly Communications Unintentionally Jammed by RF Amplifier Nonlinear Sideband

SOLUTION: Digital RF Predistortion Reduces Unintended Sideband Enabling Friendly Communications

INTEGRATIVE SOFTWARE RADIO FREQUENCY MANAGEMENT SYSTEM AND METHOD FOR COMPENSATION OF NONLINEAR RESPONSE IN RADIO FREQUENCY DEVICES

CROSS-REFERENCE TO RELATED APPLICATIONS

This application claims the benefit of U.S. Provisional Application Nos. 62/098,913, filed Dec. 31, 2014, 62/102,994 filed Jan. 13, 2015 and 62/219,304, filed Sep. 16, 2015, and which are hereby incorporated herein by reference in their entirety.

STATEMENT OF RIGHTS TO INVENTIONS MADE UNDER FEDERALLY SPONSORED RESEARCH

This invention was made with Government support by the Department of Defense, under Contracts W91RUS-12-C-0017, W91RUS-13-C-0016, W15P7T-13-C-A930, and W91RUS-13-C-0019. The Government may have certain rights in the invention.

TECHNICAL FIELD

The invention relates to methods for improving the efficiency, bandwidth, and dynamic range of radio frequency systems in general, and specifically some embodiments relate to methods for achieving some or all of these improvements through digital compensation for nonlinear response of analog radio frequency (RF) components.

DESCRIPTION OF THE RELATED ART

Almost all radio frequency (RF) systems, whether they be radios, radars, jammers, or spectrum monitors, make use of analog RF amplifiers. In RF transmitters, these are typically power amplifiers (PA), whereas in an RF receiver, a low-noise amplifier (LNA) may be used. In many applications, these amplifiers must be operated near their compression point for maximum efficiency, where the response is highly nonlinear, resulting in spurious emissions such as harmonics and intermodulation products (IMP). However, many modern applications, such as high bandwidth digitally modulated communication systems, require a highly linear response of the amplifier to avoid signal distortion and/or interference with other signals in the vicinity.

To mitigate this problem, a number of PA linearization techniques have been developed, such as feed-forward, feedback, and third-order predistortion. All of these have specific drawbacks which limit their performance when applied to complex, wideband signals, including bandwidth limitations, stability and drift problems, and aggravation of higher order distortion products. Improvement in individual nonlinear spurs with these methods is typically about 20 dB.

One approach to maximizing the linearity of the PA is to operate it backed off from its 1 dB compression point (P1 dB). However, the amplifier is much less power efficient in this regime. This approach would therefore result in using a larger, more costly amplifier operated at less-than-optimal efficiency.

Predistortion methods, in which the input signal to the amplifier is "predistorted" to compensate for nonlinearities in the amplifier response, do not require modification of the amplifier, and they are intrinsically compatible with high power amplifiers (as they operate on the relatively low-power input signal to the amplifier). Predistortion approaches are quite versatile, and are generally compact, low-cost, low-power solutions, as they can be applied in software mode to a digitally-generated waveform, or via a hardware toolkit that contains mixed signal and digital signal processing hardware to process the analog waveform. Historically, due to hardware architecture, data rate, and processing speed limitations, predistortion has been applied only to baseband and, more recently, intermediate frequency (IF) signals. With the advent of software-defined radios, multiple signal bands may be generated in a single transmitter and sent to a PA with bandwidth of 1 GHz or more. In such a situation, conventional baseband third-order predistortion methods—which typically inject a signal 180° out-of-phase with the third-order intermodulation product (IMP3)—become complex and impractical, as eliminating the IMP3 of one signal will generate additional spurs that interfere with other signals within the amplifier bandwidth. In addition, the reported bandwidth of signals to which predistortion has been successfully demonstrated is in the low tens of MHz, while for many modern applications over 1 GHz bandwidth may be required.

A less commonly used approach for linearization is post-distortion, which uses a similar approach as predistortion, except the nonlinear compensation is applied on the output signal from the amplifier. One reason it is less frequently used is that the output from the amplifier may be a high power signal (e.g. from a power amplifier) which may be technically challenging to operate on. Some conventional approaches implement predistortion on a transmitter to compensate for nonlinear effects internal to the transmitter itself, and implement postdistortion on a receiver to compensate for nonlinear effects internal to the receiver.

BRIEF SUMMARY OF EMBODIMENTS

Embodiments of the systems and methods disclosed herein relate to an Integrative Software Radio Frequency Management System (ISRFMS) that can be implemented to mitigate or eliminate nonlinear distortion (including intermodulation products (IMPs), harmonics, and sidebands) of non-linear devices in a communication system or other system using radio frequency signals such as, for example radar systems and other RF devices. Various embodiments are implemented as an integrative software radio. Nonlinear devices for which nonlinear distortion can be mitigated or removed may include, for example, RF amplifiers, analog-to-digital converters (ADCs), digital-to-analog converters (DACs), couplers/splitters, filters, and attenuators.

According to an embodiment of the disclosed technology, systems and methods may be implemented to address nonlinearity compensation by performing direct digital predistortion on the RF waveform. This approach, which may be enabled by improvements in state of the art mixed signal hardware and an accurate but computationally efficient method for generating the compensation signal, is much more effective at eliminating harmonics and intermodulation distortion of all orders. The reason is quite simply that the power amplifier nonlinear response and the predistortion compensation both act on the full RF waveform. Therefore, if the amplifier nonlinear response can be well characterized, the compensation can be very effective, and does not depend on the detailed content of the input signal.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the systems and methods disclosed herein relate to an Integrative Software Radio Frequency Management System (ISRFMS) that can be implemented to mitigate or eliminate nonlinear distortion (including intermodulation products (IMPs), harmonics, and sidebands) of non-linear devices in a communication system.

Figure 1:
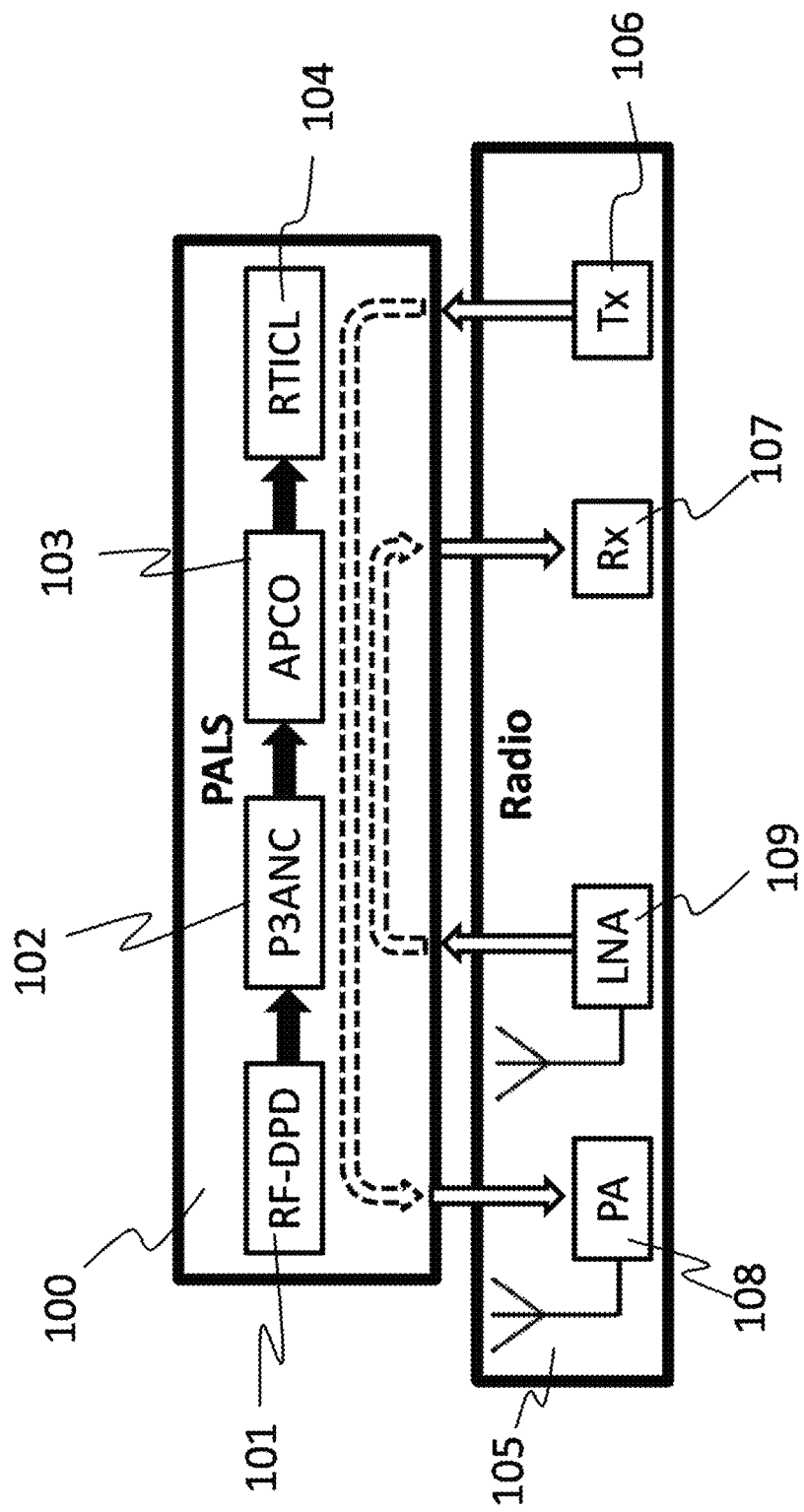
FIG. 1 is a diagram illustrating an example of an Integrative Software Radio Frequency Management System (ISRFMS) for mitigating or eliminating nonlinear distortion in accordance with one embodiment of the systems and methods described herein.

FIG. 1 is a diagram illustrating an example of an Integrative Software Radio Frequency Management System (ISRFMS) for mitigating or eliminating nonlinear distortion in accordance with one embodiment of the systems and methods described herein. Referring now to FIG. 1, in this example, the ISRFMS 100 includes four innovative components: (1) an RF Digital Pre- or Post-Distortion Paradigm (RF-DPD) 101; (2) a Parallel Pipelined Polynomial Algorithm for Nonlinear Compensation (P3ANC) 102; (3) an Automated Polynomial Coefficient Optimizer (APCO) 103; and (4) Remote Transmitter Impairments Compensated Locally (RTICL) 104.

The ISRFMS 100 may be integrated into a wide variety of RF systems. FIG. 1 shows an example of the ISRFMS 100 integrated with a generic radio 105. In this example, radio 105 includes an RF transmitter 106 and a receiver 107. On the transmit side, ISRFMS 100 is integrated in the radio 105 between the transmit signal generator 106 and the RF power amplifier (PA) 108. In some embodiments, the ISRFMS 100 can be implemented as a Predistortion-based Adaptive Linearization System (PALS).

On the receive side, ISRFMS 100 is integrated in the radio between the low-noise amplifier (LNA) 109 and the receive signal acquisition 107. Although both PA 108 and LNA 109 may include one or more stages, only one is shown in FIG. 1 for clarity of illustration. Also, the ISRFMS 100 may be integrated into the receive segment of the radio, the transmit segment of the radio, or both segments.

RF Digital Pre- or Post-Distortion Paradigm (RF-DPD) 101 can be implemented and configured to provide an effective and versatile methodology for addressing the source of nonlinearity in an RF system. Parallel Pipelined Polynomial Algorithm for Nonlinear Compensation (P3ANC) 102 can be implemented and configured to enable effective implementation of the RF-DPD paradigm, in some embodiments with readily-available commercial-off-the-shelf hardware components. Automated Polynomial Coefficient Optimizer (APCO) 103 can be implemented and configured to adapt to changes in the nonlinear response of the RF system; and a remote impairments compensation module, or Remote Transmitter Impairments Compensated Locally (RTICL) 104, can be implemented and configured to add the capability to compensate for nonlinearities in received signals not necessarily generated within the receiver itself, including algorithms for Adaptive Exfiltration of Spectral Signals (ADESS) from wideband spectral data.

In accordance with various embodiments, a new class of Wideband Adaptive Intelligent Software-Defined Radio (WAISDR) is provided, integrating ISRFMS components, listed above, with additional radio components to provide advanced radio capabilities. These capabilities could not be implemented with prior art approaches, and embodiments may be configured to address two fundamental challenges of any software-defined radio (SDR) system: computational efficient processing of wideband signals, and mitigation of nonlinear artifacts from the analog RF front end.

In various embodiments, ISRFMS may be configured to enable postdistortion to be implemented on a receiver to compensate for nonlinear effects external to the receiver, for example from a remote nonlinear transmitter—we refer to this capability as Remote Transmitter Impairments Compensated Locally (RTICL).

Figure 2:
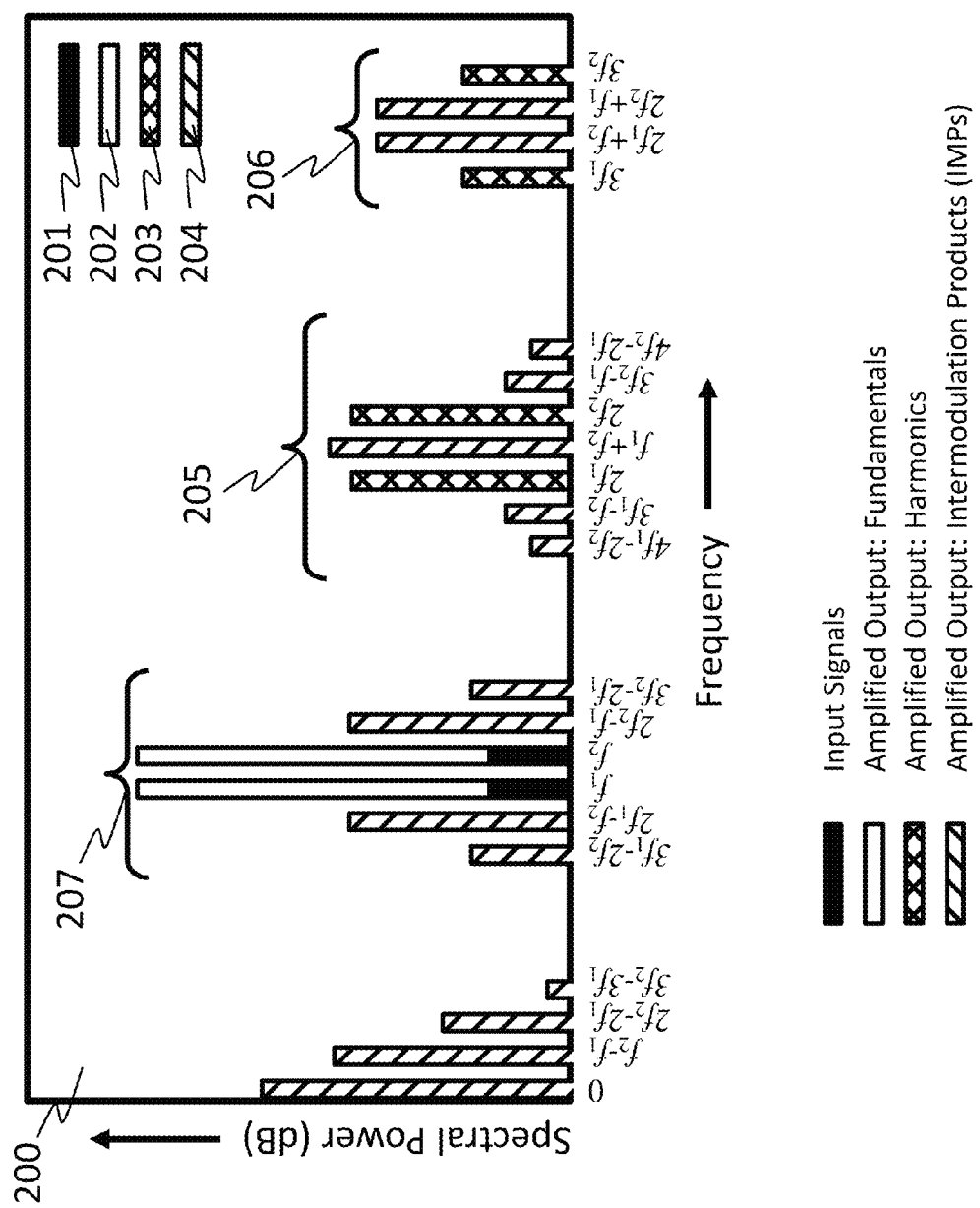
FIG. 2 shows an example of the RF frequency spectrum at the output 200 of a nonlinear amplifier.

FIG. 2 shows an example, based on measured data obtained by the inventors, of the RF frequency spectrum at the output 200 of a nonlinear amplifier. In this case, an input signal 201 having two tones, $f_1$ and $f_2$, is supplied to the input port of the amplifier. The amplified signals at the output port contain these two fundamental signals 202 at a power level determined by the linear gain of the amplifier. A whole host of additional signals also exit the amplifier, including harmonics (multiples) of the fundamental signals 203 and intermodulation products (multiples of additive combinations of the fundamental signals) of the two fundamental frequencies 204. These nonlinear products can also be grouped according to the harmonics around which they are centered. Higher order harmonic bands, such as the $2^{nd}$ harmonic band 205 or the $3^{rd}$ harmonic band 206, can sometimes be removed or reduced at the transmit or receive segment by use of bandpass filters. However, it is much harder to use bandpass filters to remove nonlinear components in the fundamental band 207 due to the sharp roll-off required of the filter to avoid attenuation of the fundamental frequencies 202.

Figure 3:
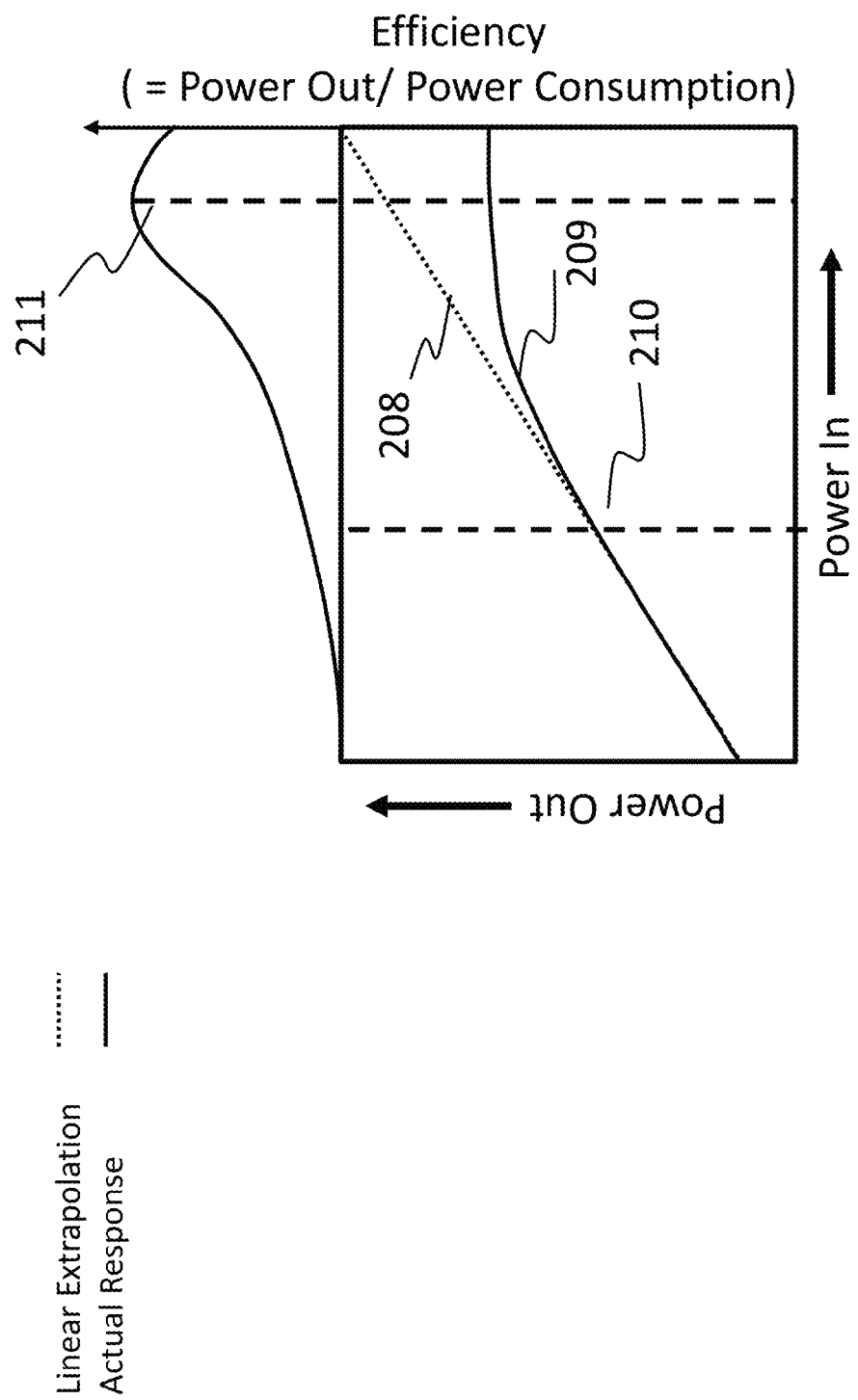
FIG. 3 is a diagram illustrating a comparison of a working point for conventional state-of-the-art (SOTA) and nonlinear compensation in accordance with various embodiments of the systems and methods described herein.

FIG. 3 is a diagram illustrating a comparison of a working point for conventional state-of-the-art (SOTA) and nonlinear compensation in accordance with various embodiments of the systems and methods described herein. The example of FIG. 3 shows a simplified transfer function (power out versus power in) for an amplifier. In practice, above 1 dB compression point (P1 dB 210) of the amplifier, the amplifier response deviates from the ideal linear response 208 to follow a nonlinear curve 209. The simplest approach to maximizing the linearity of the PA would therefore be to operate it backed off from its 1 dB compression point (P1 dB). However, the amplifier is much less power efficient in this regime. In fact, for many amplifiers, the maximum efficiency point 211 is well within the nonlinear regime of the amplifier. Therefore, this back-off approach would result in using a larger, more costly amplifier operated at less-than-optimal efficiency.

Predistortion methods, in which the input signal to the amplifier is predistorted to compensate for nonlinearities in the amplifier response, do not require modification of the amplifier, and they are intrinsically compatible with high power amplifiers (as they operate on the relatively low-power input signal to the amplifier). Predistortion approaches are quite versatile, and are generally compact, low-cost, low-power solutions, as they can be applied in software mode to a digitally-generated waveform, or via a hardware toolkit that contains mixed signal and digital signal processing hardware to process the analog waveform.

In contrast to conventional systems that apply predistortion to baseband and intermediate frequency (IF) signals, embodiments of the ISRFMS may be configured to compensate for the nonlinearity itself, rather than compensating for individual nonlinear signals. Accordingly, such embodiments may be much more effective when applied to radios that operate with wideband, dense signal sets. Embodiments of the ISRFMS achieves this by operating directly on the full RF carrier signal entering the amplifier, which is referred to herein at times as digital predistortion (RF-DPD). This is differentiated over conventional digital predistortion, which operates on baseband signals much further from the main source of nonlinearity (typically the RF power amplifier), as shown in FIG. 3.

Moving the predistortion closer to the amplifier in the RF chain has been performed by the inventors using both analog RF predistortion, and digital RF predistortion, measurement test results of which are provided below. However further embodiments of the systems and methods disclosed herein provide a nonlinear compensation methodology to effectively and efficiently implement this RF-DPD paradigm using innovative nonlinear compensation functions and algorithms and readily-available hardware components. Comparison between example implementations of these two embodiments are shown in FIG. 4.

Figure 4:
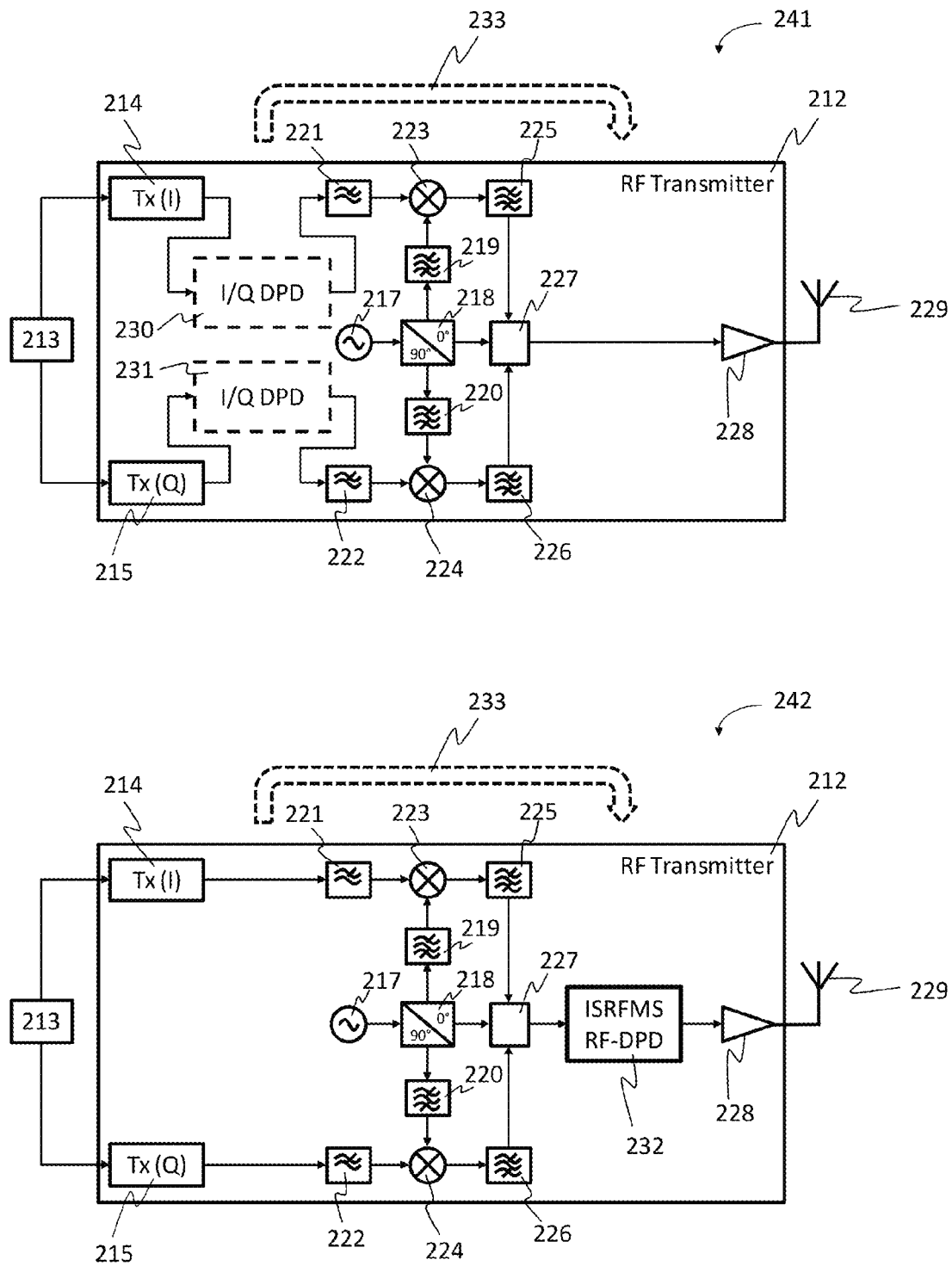
FIG. 4 illustrates a comparison of digital predistortion (DPD) operating on baseband I/Q signals, and the RF-DPD operating on the RF signal in accordance with embodiments of the technology disclosed herein.

FIG. 4 illustrates a comparison of digital predistortion (DPD) operating on baseband I/Q signals 241, and the RF-DPD operating on the RF signal 242 in accordance with embodiments of the technology disclosed herein. Referring now to FIG. 4, this example illustrates an RF transmitter 212, in which the signal to be transmitted 213 is encoded into in-phase (I) 214 and quadrature (Q) 215 components, then upconverted to the RF carrier frequency by means of an upconverter, also sometimes referred to as a tuner or a modulator. The illustrated upconverter includes lowpass filters 221, 222, mixers 223, 224, bandpass filters 219, 220, 225, 226, RF oscillator 217, 90-degree RF splitter 218, and RF coupler 227. The signal is then amplified at the RF carrier frequency by an RF amplifier 228 prior to exiting the transmit antenna 229. The upconverted signal could be constructed from analog RF hardware components or digital RF software components.

In the embodiment 241 in which digital predistortion (DPD) 230, 231 applied to the I/Q signals, this predistortion is applied away from the primary source of nonlinearity, which is the RF power amplifier 228. In contrast in the second embodiment 242, ISRFMS RF-DPD 232 acts on the RF signal entering the amplifier 228. Since the nonlinear compensation has been moved from a point distant from the nonlinearity to a point closer to the primary source of the nonlinearity in this second embodiment 242, the nonlinear compensation can be more effective as compared to the first embodiment 241.

To reduce the nonlinear effects of an amplifier through predistortion, in various embodiments a mathematical model of the nonlinear response may be created and used to generate an inverse of the nonlinearity. This inverse is then applied to the input signal of the amplifier to cancel out some or all of the nonlinearities. Signal nonlinearities can be divided into three main categories: (1) memoryless (static) nonlinearities; (2) nonlinearities with linear memory; (3) nonlinearities with nonlinear memory. In systems with memoryless nonlinear response, the instantaneous output value, y, is a function of only the instantaneous input value, x. Although this is the simplest category of nonlinear response, it often forms a good starting point for introducing memory effects. Two simple conventional functions that may be used to qualitatively model a static nonlinearity are: the hyperbolic tangent, $y=\tan h(x)$, and the inverse tangent, $y=\arc \tan(x)$. Both functions are linear for small values of x, and saturate at a constant value for large (positive or negative) values of x. Other models of static nonlinearity are the Saleh model and Hetrakul-Taylor model. These functions have only a few tunable parameters, and hence are limited to specific nonlinear responses. More general approaches use series models, such as power series and Fourier series, which can have an unlimited number of tunable parameters in principle.

The next level of complexity in modeling nonlinear response involves the introduction of linear memory. This is equivalent to a frequency-dependent static model. Thus, many models of nonlinear responses with linear memory are based on the above static models, but with frequency-dependent parameters. The frequency degree of freedom is accounted for in real-time nonlinearity compensation methods by adding a second dimension to the LUT or compensation function, indexed by the (current-previous) value, which effectively is a measure of the instantaneous rate of change of the signal.

Nonlinear models with nonlinear memory are the most complex of the nonlinear models. The most common, although not necessarily the simplest, models in this category are the Volterra series-based models. The Volterra series approach takes the convolutional integral description of a causal linear system with memory, and combines it with a power series model of a memoryless nonlinear system.

Embodiments of the systems and methods described herein provide a nonlinear model that provides accuracy and versatility while reducing or minimizing computational complexity in order to operate on high-throughput (e.g. 50 Gbps or more) RF digital data streams with reduced or minimal hardware size, weight, and power consumption required for practical implementation.

Further embodiments of the systems and methods described herein provide a nonlinear model that can be implemented within the RF-DPD paradigm and methodology, i.e. the nonlinear compensation is applied to the RF carrier signal. With conventional models, the input and output signals (x and y), as well as the model parameters, are complex-valued (containing real and imaginary components), since the models were designed to operate on baseband I/Q data with the RF carrier frequency removed. In some cases, as in the Saleh model, the nonlinear model is specified in terms of amplitude and phase of the baseband signal, rather than I/Q. Neither case can be directly applied to nonlinear compensation of the full RF signal without modification to account for the inclusion of the carrier frequency.

RF Digital Predistortion (RF-DPD) in accordance with various embodiments may be configured to provide a versatile methodology that can be implemented with readily-available commercial-off-the-shelf hardware components, to reduce the nonlinear response of an amplifier by performing either a predistortion (on the input of a power amplifier) or a post-distortion (on the output of a low-noise amplifier) in the digital domain. This may be performed directly on the RF signal entering or exiting the amplifier. This may be referred to herein as RF Digital Pre(Post)Distortion (RF-DPD).

The biggest challenge in implementing digital processing of RF signals at the carrier frequency is developing algorithms that can be implemented with extremely high data throughput (e.g. 50 Gbps). To accommodate this, embodiments may be configured incorporating readily-available off-the-shelf analog-to-digital converters (ADCs), field programmable gate arrays (FPGAs), and digital-to-analog converters (DACs), with data rates and processing power sufficient for direct digital acquisition, processing, and generation of the full RF waveform. For example, silicon-based ADCs and DACs with sampling rates of 5 GHz and 10-bit resolution per sample may be used, as may off-the-shelf components with greater than a 50 GHz sampling rate, which are becoming available commercially. Although the technology disclosed herein does not require specific hardware components for implementation, these readily available state-of-the-art digital signal processing components may be used.

Figure 5:
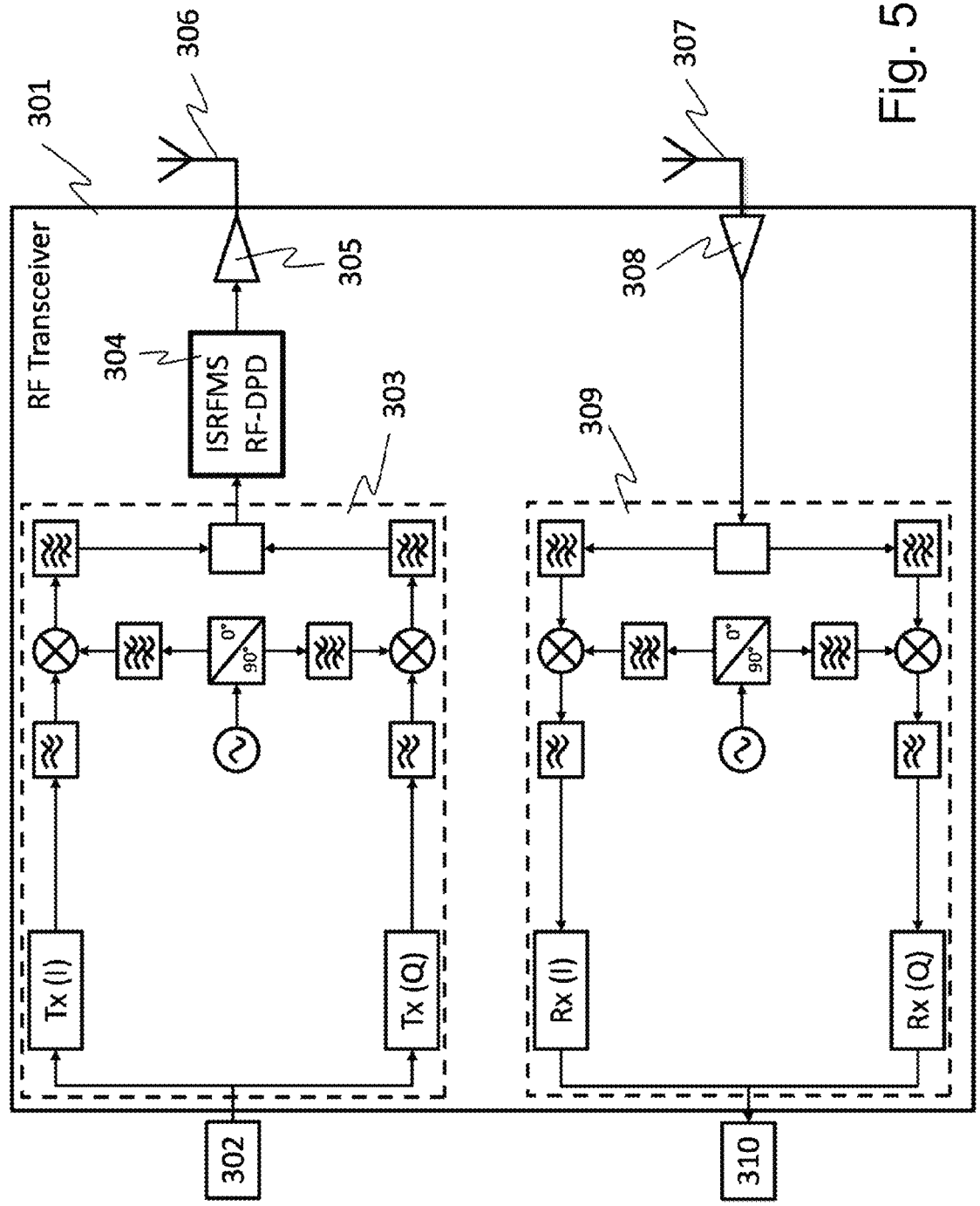
FIG. 5 is a diagram illustrating an example RF transceiver with the ISRFMS RF-DPD integrated into the RF transmitter in accordance with one embodiment of the technology described herein.

One implementation of the above nonlinear compensation methodology incorporates digital RF predistortion for reducing nonlinear components in the output signal of a radio transmitter. The term radio transmitter is used herein to refer to any RF transmitter that generates an RF output signal by using an RF mixer (analog or digital) to upconvert a baseband or IF signal to a desired RF carrier frequency. This includes the majority of conventional radios in use today, including commercial cellular phones, and most software-defined radios (which typically generate baseband or IF signals in software). FIG. 5 is a diagram illustrating an example RF transceiver with the ISRFMS RF-DPD integrated into the RF transmitter. Referring now to FIG. 5, this example shows an RF transceiver 301. The information to be transmitted 302 is encoded and upconverted 303 whereupon the signal nonlinearity is compensated via RF digital pre-distortion 304. The compensated signal is amplified by an RF power amplifier 305 and transmitted over the air by a transmit antenna 306. The receive antenna, 307, receives over-the-air RF signals, amplifies them via a LNA, 308, then extracts the message information, 310, via a downconverter (analog or digital), 309.

The dominant nonlinear response is normally introduced by the power amplifier. However, the nonlinear compensation methodology in accordance with the systems and methods disclosed herein can also compensate for other sources of nonlinearity in the RF chain, such as the RF coupler, mixers, ADC, or DAC. However, to maximize the effectiveness of the nonlinear compensation, the ADC and DAC are preferably operated with input signals at levels that the nonlinear effects from these components are negligible. This can be achieved through insertion of appropriate attenuators at the input ports of the ADC and DAC, as required. Note that, unlike conventional predistortion methods that attempt to compensate for the nonlinear response of the amplifier at a point in the RF chain far removed from the primary source of the nonlinearity, digital RF predistortion approaches according to various embodiments perform the nonlinear compensation closer to the source of the non-linearity and indeed as close to the source of the nonlinearity as is possible, e.g., right next to the amplifier. The resultant simplification of the nonlinear compensation process enables this method to compensate for the nonlinear response itself, rather than simply cancelling individual signals resulting from the nonlinear response.

Another implementation of the above nonlinear compensation methodology incorporates RF digital postdistortion (RF-DPD) for reducing nonlinear components in a radio receiver. The term radio receiver can be used to refer to any RF receiver that acquires a signal by using an RF mixer (analog or digital) to downconvert a baseband or IF signal from the RF carrier frequency. This definition includes the majority of conventional radios in use today, including commercial cellular phones, and most software-defined radios (which typically generate baseband or IF signals in software).

Figure 6:
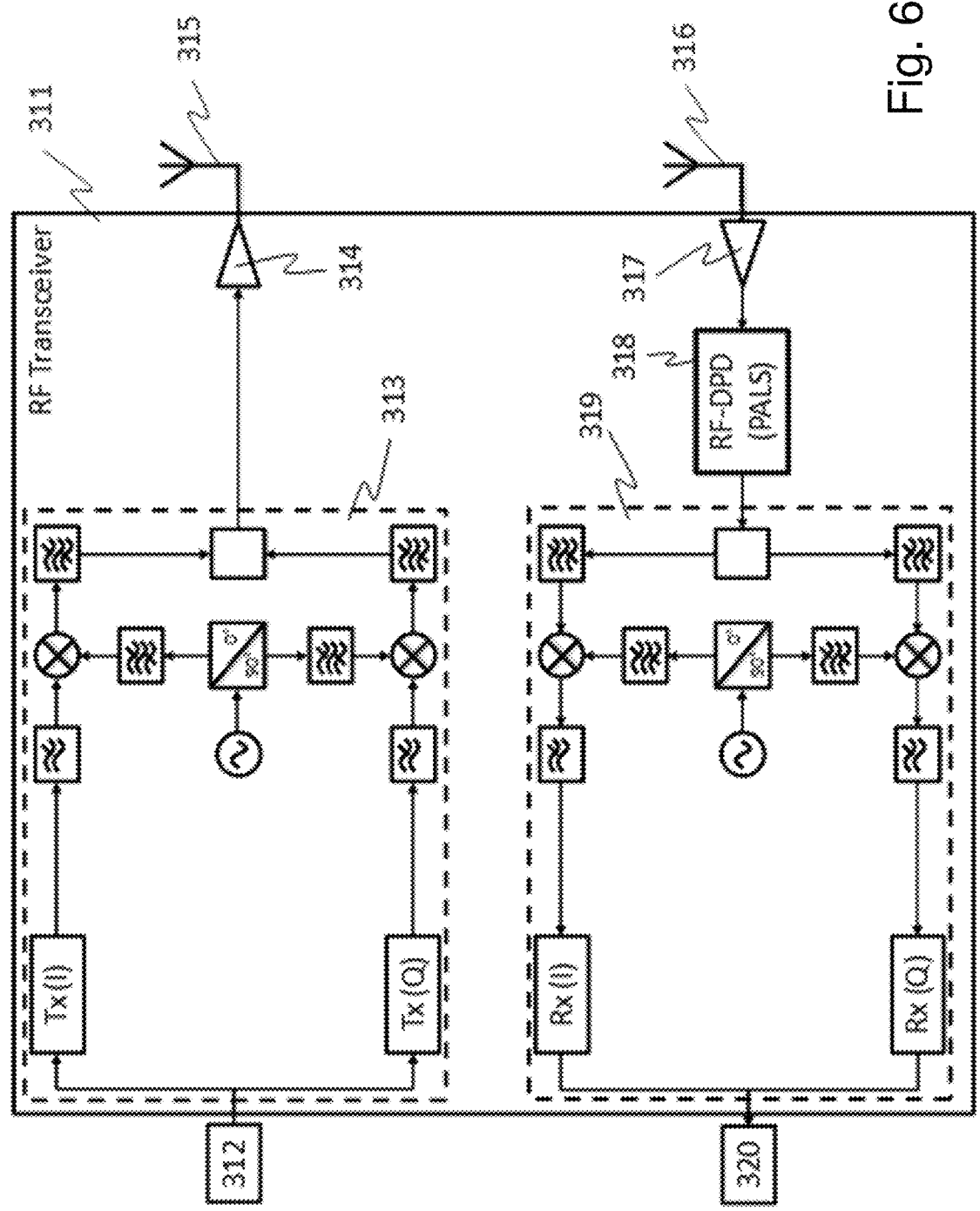
FIG. 6 illustrates a RF transceiver with an ISRFMS RF-DPD integrated into the RF receiver in accordance with one embodiment of the systems and methods described herein.

FIG. 6 illustrates a RF transceiver with an ISRFMSRF-DPD integrated into the RF receiver in accordance with one embodiment of the systems and methods described herein. In the example of FIG. 6, the RF transceiver 311 includes a source of information to be transmitted 312, a transmit block 313 to encode and upconvert the information signal, and an RF power amplifier 314, to up convert the amplified signal, and a transmit antenna, 315 to transmit the RF signal over the communication channel (e.g., the air). The receiver includes a receive antenna 316 to receive over-the-air RF signals, a LNA 317 to amplify the received signals, a RF digital postdistortion block 318 to compensate for signal nonlinearity, and a receiver block 319 to recover the message information, via a downconverter (analog or digital).

In most communication receivers, and the dominant nonlinear response is normally generated by the low-noise amplifier, which is why nonlinear compensation may be referred to as a postdistortion. However, the nonlinear compensation methodology can also compensate for other sources of nonlinearity in the RF chain, such as the RF splitter, mixers, ADC, or DAC. However, to maximize the effectiveness of the nonlinear compensation, the ADC and DAC should be operated with input signals at levels that the nonlinear effects from these components are negligible. This can be achieved through insertion of appropriate attenuators at the input ports of the ADC and DAC, as required. The digital RF postdistortion will offer most benefits when used with high amplitude, wideband, input signals, whose nonlinear sidebands can effectively reduce the sensitivity of the receiver.

Figure 7:
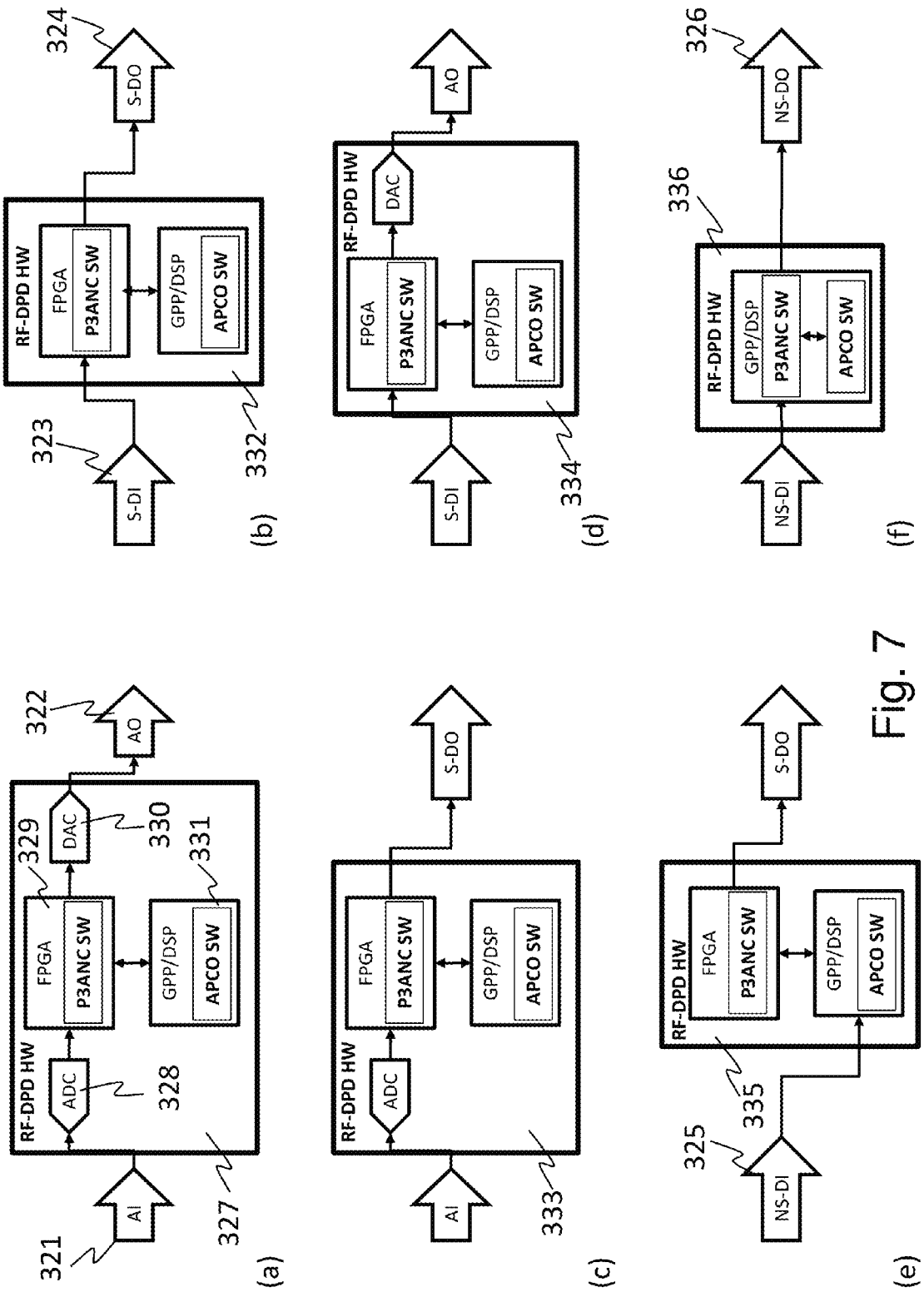
FIG. 7 illustrates an example of input/output versatility of the ISRFMS RF-DPD in various embodiments.

FIG. 7 illustrates the input/output interface versatility of the ISRFMSRF-DPD in various embodiments by showing example implementations of the RF-DPD paradigm with analog input signals 321, analog output signals 322, streaming digital input signals 323, streaming digital output signals 324, non-streaming digital input signals 325, and non-streaming digital output signals 326.

The analog input-analog output case 327 shown in part (a) FIG. 7 is the most versatile, but not necessarily the most power efficient, as it involves digitizing the analog signal with an ADC 328 then reconverting back to an analog signal with a DAC 330. The FPGA 329 inserted between the ADC and DAC performs real-time nonlinear compensation with the P3ANC implemented as FPGA firmware. A general purpose processor (GPP) or digital signal processor (DSP) may be included as part of the APCO subsystem (further described below with reference to FIG. 10), or, if adaptive capabilities are not required for the application, the GPP/DSP may be used as a simple control interface to allow the user to set the P3ANC coefficients.

In cases where the radio system where FMS is to be applied is largely built from analog components, then the analog input-analog output case, 327, may be a desirable approach for integrating FMS with the radio. However, in radios where a DAC is used to generate the RF signal, the streaming-digital-input/streaming-digital-output implementation 332 (part (b) of FIG. 7) may be more effective and efficient, as the number of conversions between analog and digital domains can be reduced or minimized. Here, the term "streaming" is used to denote a continuous data flow, typically implemented on real-time hardware, such as an FPGA.

Depending on the exact hardware configuration within the radio, two hybrid modes 333, 334 can be implemented, which use either an ADC or a DAC, respectively to convert from, or to, an analog signal. An example of this is shown in part (c) and part (d) of FIG. 7.

Yet another example implementation case is for a non-streaming digital input with a streaming digital output 335, which is shown in part (e) of FIG. 7. This case could arise, for example, when the digital RF waveform is defined within the ISRFMS itself. For example, the non-streaming digital input could include a script of signals, that are to be generated in the GPP/DSP/FPGA. Another example is a repeated signal, where the non-streaming input includes the sample of the waveform to be repeated, and the FPGA generates a streaming output by repeatedly sending this waveform sample.

A further example implementation case involves non-streaming digital input and output signals 336, as shown in part (f) of FIG. 7. In this example, no real-time hardware (e.g. FPGA) is involved, and all ISRFMS algorithms are implemented on a non-real-time computing platform, such as a GPP or DSP. This is equivalent to offline processing of data, to be supplied to the radio for processing by separate hardware.

One challenge with implementing digital predistortion or postdistortion in real time on a full RF waveform is defining a nonlinear compensation algorithm that makes good use of the available hardware resources. Specifically, the maximum clock rate at which an arithmetical operation can be performed on a FPGA is typically in the 50-500 MHz range. The actual maximum will in general depend on numerous factors, including the FPGA hardware design, the resource usage on the FPGA, and the architecture of the algorithm. In general, the more complex and sophisticated the algorithm, the lower the maximum clock rate the FPGA will support. Pipelining of FPGA code can partially mitigate this issue. On the other hand, ADCs can digitize incoming analog RF signals at over 5 GHz. To operate on this large digitized signal bandwidth without loss of data, the FPGA code is preferably readily parallelizable, i.e. able to be implemented in multiple parallel instantiations.

Accordingly, various embodiments of the systems and methods disclosed herein use a polynomial in the input signal value and input signal derivative to model and compensate for the nonlinear response of an RF transmit or receive system. A polynomial can be advantageous in various embodiments as it can be adjusted in real-time or near-real time as conditions change. A polynomial model contains only adders and multipliers, making it suitable for pipelined implementation on a high-throughput FPGA. Because it depends only on the instantaneous value and derivative of the input signal, the input datastream can be deserialized in the FPGA and multiple instantiations of the polynomial can be implemented simultaneously—this enables extremely high data processing rates to allow direct processing of the full RF waveform.

Another benefit of a polynomial model is that it is highly versatile, and can be applied to RF nonlinearities of diverse physical origins, including, but not limited to, solid state and travelling-wave tube (TWT) amplifiers, ADCs, DACs, couplers, and any combination of these components in a system. A polynomial model can also provide a simple way to trade off model complexity for performance by adding or removing terms in a polynomial. Typically no more than six orders are needed in the polynomial, for reduction of most nonlinear spurious signals.

The signal derivative, (or in practice for discretely sampled data, the difference between successive signal values) is included in the polynomial in addition to the input signal value to provide control over the phase of the output signal. Recall that for conventional nonlinear modeling, the model coefficients may be complex or include separate coefficients for amplitude and phase of the input/output signals. This additional degree of freedom is provided in various embodiments of the nonlinear model by the signal derivative.

Figure 8:
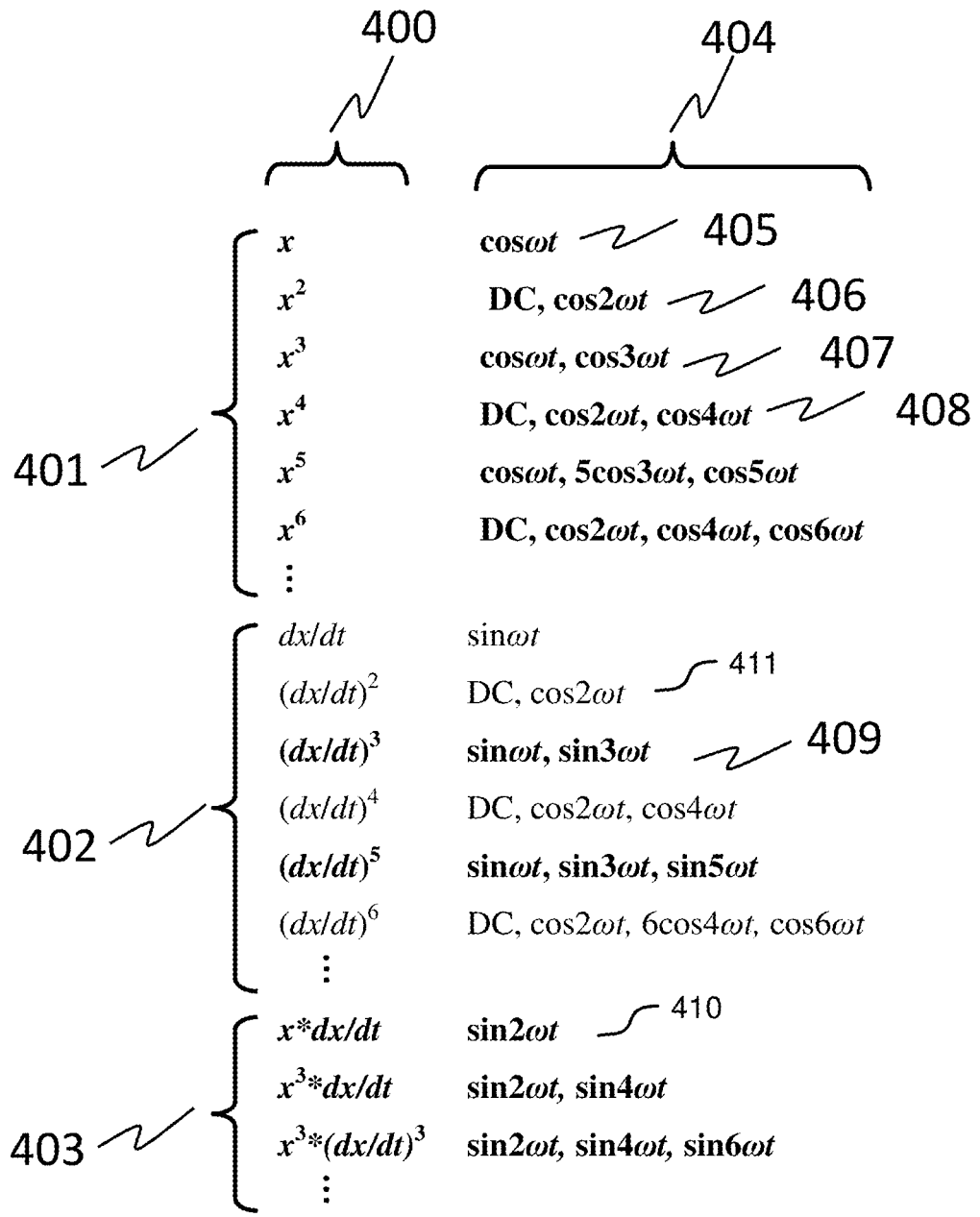
FIG. 8 illustrates examples of terms that may be included in the ISRFMS P3ANC polynomial as well as resultant harmonics from each term in the polynomial.

Still further embodiments may be configured to use a polynomial containing specific products of the input signal value, x, and the input signal derivative with respect to time, dx/dt, to compensate for RF nonlinearities as a predistortion or postdistortion. FIG. 8 illustrates examples of terms 400 that may be included in the polynomial. Also shown in FIG. 8 are the resultant harmonics 404 from each term in the polynomial. To illustrate the phase content of each term, consider an input function x=A cos ωt as an example to demonstrate the approach. Embodiments may be configured to apply this method to more general input functions by decomposing these input functions into their Fourier components. For the above input function, the linear term generates components proportional to cos ωt, 405.

As a rule, the number of terms to be included in the polynomial should be the minimum needed to provide the necessary reduction of nonlinear signal content in the output signal, in order to obtain maximum benefit with the least amount of hardware resource usage, which in practice may result in reduction in size, weight, power consumption, and cost of the hardware on which the P3ANC is implemented.

The simplest choice of terms to include in the P3ANC polynomial are products of the input signal value. Pure products of the value alone 401 generate only cosine harmonics, such as the $2^{nd}$ harmonic cosine generated by the $x^2$ term 406. If significant phase delays exist in the nonlinear response (and for high-frequency signals this is likely to be the case in practice), then these cannot be compensated for by the products of the value alone 401, and products of the input signal derivative (or difference between current and previous value, for a discretely sampled signal) 402, must be included. For example, $x^3$ generates a $3^{rd}$ harmonic cosine term 407, and $(dx/dt)^3$ generates a $3^{rd}$ harmonic sine term 409, providing full phase control over the $3^{rd}$ harmonic.

However, using pure products of the value 401, or derivative 402, separately does not provide phase control of the even harmonics. For this purpose mixed products of the value and derivative 403 must be included. For example, $x^2$ generates a $2^{nd}$ harmonic cosine term 406, and x*(dx/dt) generates a $2^{nd}$ harmonic sine term 410, providing full phase control over the $2^{nd}$ harmonic.

As these examples illustrate, some products generate redundant harmonic content (for example $x^2$ 406 and $(dx/dt)^2$ 411), and therefore one of these can be excluded from the polynomial. In general, a product without derivatives will be chosen over a product with derivatives, as the implementation of a product without derivatives in real-time software consumes fewer hardware resources (fewer operations and less memory usage). Also, lower order products should be chosen over higher order products for the same reason. Exceptions to these rules can arise when it is known that specific orders dominate the nonlinear response, in which case a higher order product may be chosen over a lower order product, or a product with derivatives may be chosen over a product without, in order to improve the effectiveness of the nonlinear compensation. For example, many nonlinear systems have a highly anti-symmetric response function (i.e. y(-x)=-y(x)), and therefore products of the input signal or derivative that are anti-symmetric under inversion (e.g. odd powers of the input signal value, such as $x^3$, $x^5$, ... ) will dominate the nonlinear response. In such a case, an odd-power with higher order may be included in the polynomial in detriment of an even-power with lower order to maximize the effectiveness of the nonlinear compensation, as expressed in the reduction of nonlinear signals (harmonics and IMPs) in the output signal.

The products listed in FIG. 8 are examples, and those skilled in the art after reading this description will be able to devise higher order terms using the same methodology and criteria shown in FIG. 8. The products marked in bold are those (up to sixth order) that provide non-redundant control of the output signal amplitude and phase at each harmonic. Whether all of these are included in a practical implementation of the ISRFMS P3ANC, or a reduced subset is used, will depend on the available computational resources, and/or latency constraints of the application.

A suitable embodiment of the disclosed technology is operable with five nonlinear terms (although other quantities of terms can be used) in the polynomial (in addition to the zero order and first order terms), although other functional combinations will also be apparent to those skilled in the art. One example of a nonlinear polynomial, using only products of the input signal value 401 up to order six, as modified by coefficients, $a_y$, is:

$$y = a_0 + a_1 x + a_2 x^2 + a_3 x^3 + a_4 x^4 + a_5 x^5 + a_6 x^6. \tag{1}$$

In measurements of nonlinear compensation of RF amplifiers, the inventors have discovered that polynomials such as Eq. (1) could reduce nonlinear spurious signals (harmonics and IMPs) in the output signal by 20-30 dB.

Another example embodiment is a form of Taylor Series with multiple terms using a novel combination of input signal values and differential terms in the nonlinear polynomial. A more particular example is shown in Eq. (2), which is formed using a combination of input signal value 401 and derivative products 402 as:

$$y = a_0 + a_1 x + a_2 x^2 + a_3 x^3 + a_4 x^4 + a_5 \left(\frac{dx}{dt}\right)^3 + a_6 \left(\frac{dx}{dt}\right)^5. \quad (2)$$

In measurements of nonlinear compensation of RF amplifiers, the inventors have discovered that polynomials such as Eq. (2) could reduce nonlinear spurious signals in the output of the amplifier by up to 70 dB.

Yet another example embodiment uses input signal values, differential terms, and mix terms combining input signal values and differential terms. A particular example of a nonlinear polynomial formed using input signal value products, 401, derivative products, 402, and mixed products, 403, is:

$$y = a_0 = a_1 x + a_2 x^2 + a_3 x^3 + a_4 x^4 + a_5 \left(\frac{dx}{dt}\right)^3 + a_6 x\left(\frac{dx}{dt}\right). \quad (3)$$

In measurements of nonlinear compensation of RF amplifiers, the inventors have discovered that polynomials such as Eq. (2) could reduce nonlinear spurious signals in the output of the amplifier by up to 70 dB.

In all of these examples, the coefficients $a_0$ through $a_6$ are real fixed-point or floating point numbers. It is noted that the optimal choice of terms to include in the P3ANC will depend on the characteristics of the RF nonlinearity in the frequency band of interest for the application.

Where the polynomial in Eq. (1) serves as the input signal, the system has somewhat limited ability to address all components of the nonlinear distortion, because this solution assumes that everything is constant and in phase. Therefore, the differential terms can be included to allow compensation for out-of-phase components. Various embodiments can be configured for nonlinear compensation using Taylor series polynomials like the ones in the above equations. In some embodiments, a number of terms can be optimized. Therefore, embodiments can be configured to construct a table of information, remove redundant components of the polynomial to minimize computation time, and perform the computations. In one example, the removal of redundant components favors components that are not in the derivative terms.

Figure 9:
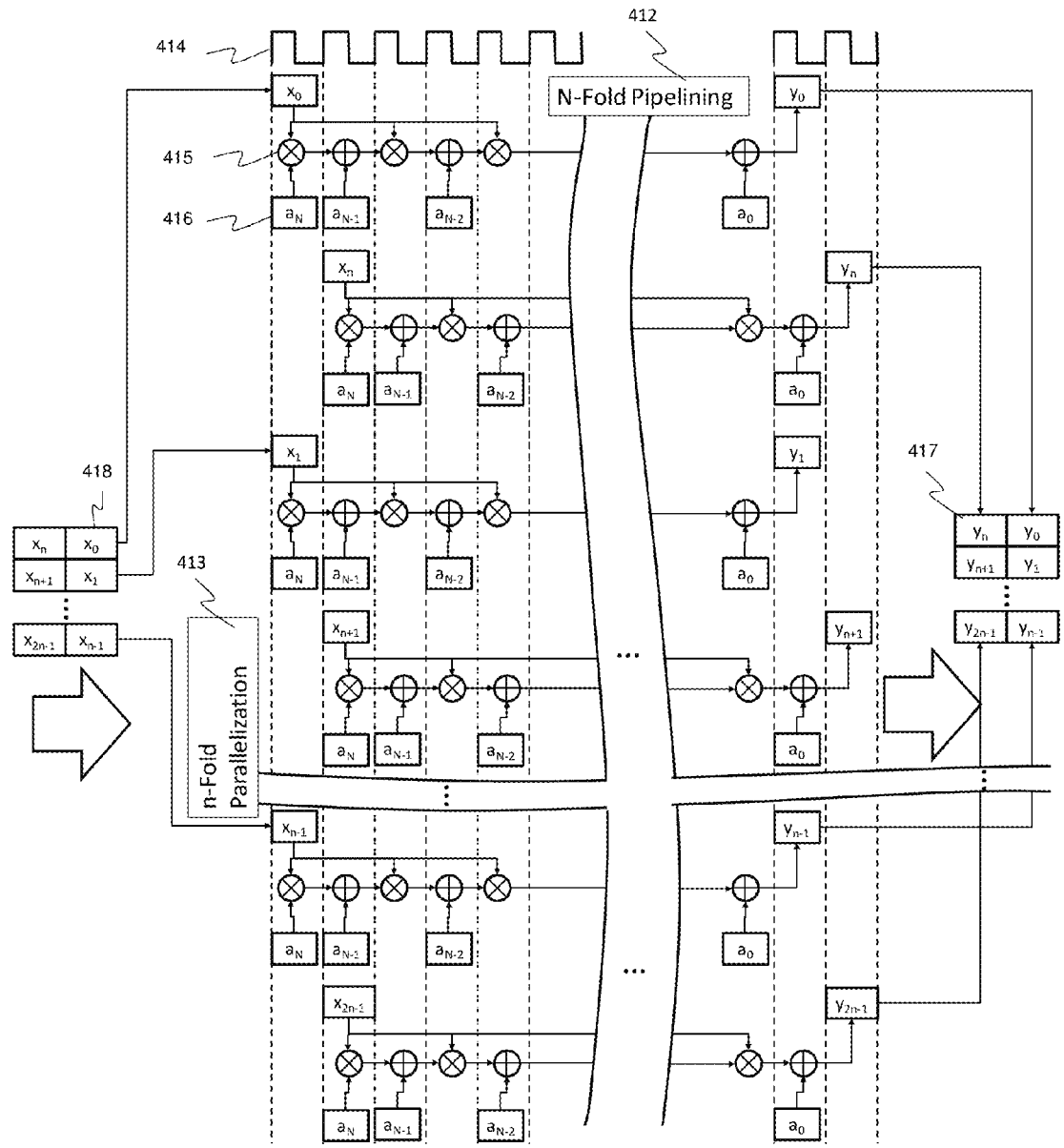
FIG. 9 illustrates an example algorithm for implementing the ISRFMS P3ANC polynomial nonlinear model on an FPGA in accordance with one embodiment of the systems and methods described herein.

An example algorithm for implementing the polynomial nonlinear model on an FPGA is shown in FIG. 9. In this example embodiment, n-Fold deserialized digital data (e.g. from an ADC) are processed with n instantiations in parallel 413. For example, in one embodiment, data sampled at 5 GHz with 10-bit precision by the ADC is de-serialized by a factor of 16, and the polynomial operation is performed with 16 parallel instantiations 413 on the FPGA, each processing data at an FPGA clock rate 409 of 312.5 MHz.

The polynomial operation itself 415, which in this example includes only addition and multiplication operations applied to the input signal value 418, and the P3ANC coefficients 416, are pipelined so that one operation (adder or multiplier) is performed each clock cycle. The pipelining is performed N times 412, where N is the number of P3ANC coefficients. For example, in one embodiment, the polynomial shown in Eq. 1 is pipelined six times. The latency (in FPGA clock cycles) is given approximately by twice the number of polynomial coefficients (one add and one multiply per coefficient). In one embodiment, where the FPGA clock rate is 312.5 MHz, and the number of polynomial coefficients is six, the latency is approximately 38 ns. The data is output 417 (e.g. to a DAC) in the same deserialized format in which it entered. Because the data input rate is equal to the data output rate, the digital data flows continuously through the FPGA, without interruption, which is referred to at times herein as streaming digital data.

Various embodiments may be configured to automatically determine the optimal coefficients of the P3ANC polynomial nonlinear model for digitally predistorting the RF input signal to an amplifier, in order to reduce nonlinear components of the amplifier output signal specified by the user. The system may perform this automatic optimization of the nonlinear compensation at startup, providing a self-calibrating feature. It may also perform the automatic optimization process at periodic intervals while the amplifier is in operation, providing adaptability to changes in the amplifier nonlinear response over time. The system can include an analog hardware design as well as algorithms for calculating the optimal predistortion coefficients.

Figure 10:
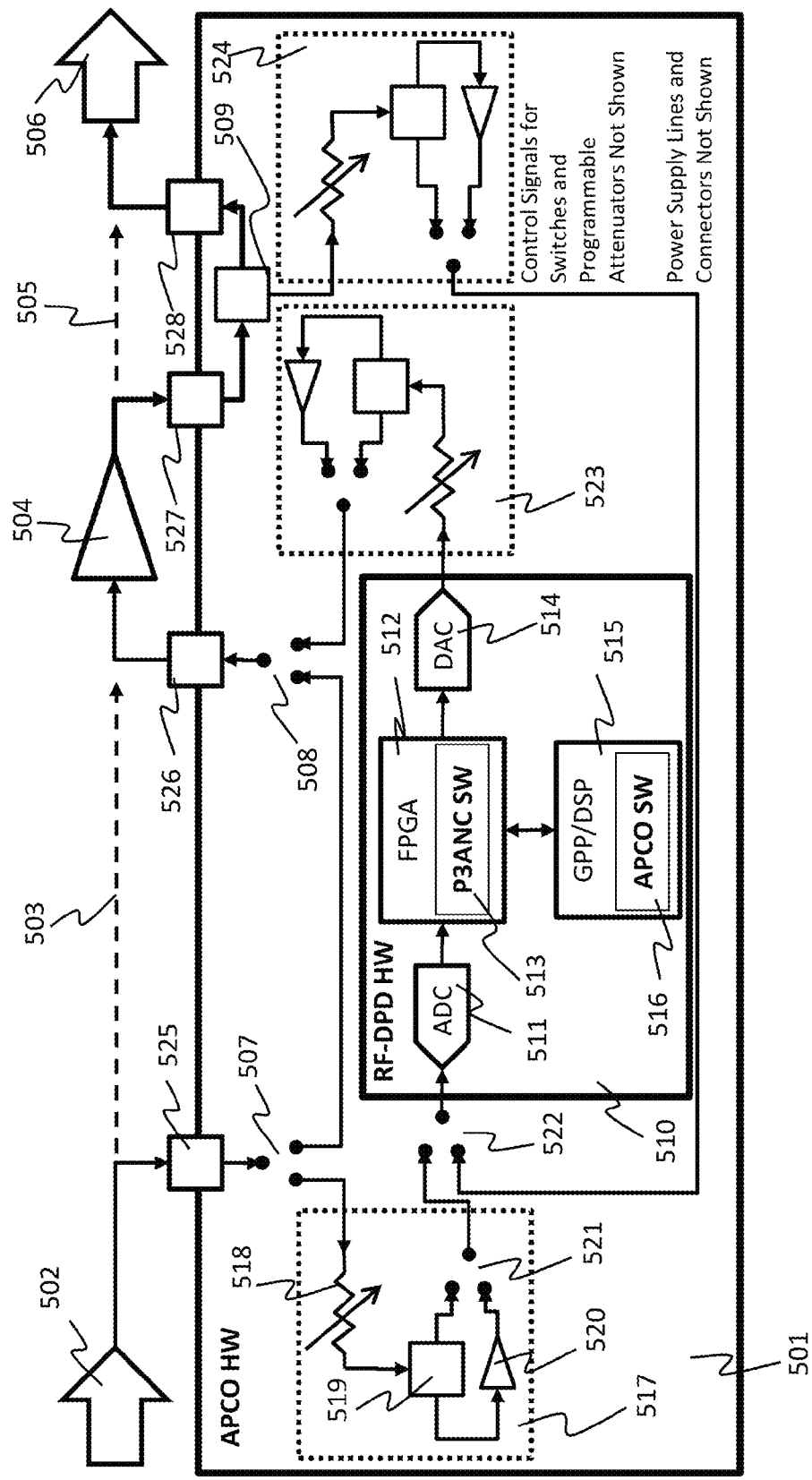
FIG. 10 is a diagram illustrating an example APCO system for adaptive and self-calibrating digital RF predistortion of a power amplifier in accordance with one embodiment of the systems and methods described herein.

FIG. 10 is a diagram illustrating an example APCO system for adaptive and self-calibrating digital RF predistortion of a power amplifier in accordance with one embodiment of the systems and methods described herein. The example shown is designed to connect to an amplifier's RF input and output ports without modification of the amplifier. Power and control signals are not shown in FIG. 10, but may be included in an implementation of the design as would be known to one of ordinary skill in the art after reading this description.

Without adaptive and self-calibrating nonlinear compensation, the amplifier 504 would normally have an input signal 502, for example from a signal generator entering the input port of the amplifier 503, and the output signal 506 exiting the output port of the amplifier 505, to be connected to a transmit antenna for example. To apply the adaptive and self-calibrating nonlinear compensation to the amplifier, the input signal 502 should be coupled to RF connector 525, and an RF connection between connector 526 and the input port of the amplifier 504 should be provided. The output port of the amplifier 504 is connected to connector 527 and the linearized amplifier output signal exits from connector 528.

With switches 507 and 508 both in the left position (relative to the signal flow direction) the input signal is supplied directly to the amplifier without passing through the RF-DPD subsystem. An RF tapper 509 taps off a small portion of the RF output signal (e.g. 0.1% of the output power) and supplies the remainder of the output signal power to the output port 528.

With switches 507 and 508 in the right position, and switch 522 in the left position, the input signal 502 is routed through the RF-DPD hardware (HW) subsystem which in the implementation shown in FIG. 10 includes an ADC 511 an FPGA 512 containing P3ANC software (SW) 513 a general-purpose processor (GPP) or digital signal processor (DSP) 515 containing APCO software 516 and a DAC 514. In various embodiments, this process may occur continually without interruption in real time unless a calibration process is taking place.

A "unity-gain' subsystem 517 including in this example programmable attenuator 518, RF splitter 519, low-noise amplifier 520, and switch 521 is used to adjust the input signal level at the input port of the RF-DPD subsystem 510 to ensure the signal is digitized with maximum resolution without inducing a nonlinear response in the ADC. The maximum attenuation of the programmable attenuator 518 may be equal and opposite to the amplification of the LNA 520 so that a wide range of input signal levels can be accepted. For example, in one embodiment the attenuator range is 0-30 dB and the amplifier gain is 30 dB. With switch 521 in the left position the amplifier is bypassed and the signal is attenuated by 0-30 dB (equivalent to 0 to −30 gain) depending on how the attenuator is programmed by the GPP or DSP 515. When switch 521 is in the right position, the LNA 520 is introduced into the RF chain and the total gain in this position ranges from 0 to 30 dB depending on the attenuator setting. Therefore in this embodiment the total gain of this "unity-gain" subsystem ranges from −30 dB to +30 dB. The reason this is referred to as a "unity-gain" subsystem is that an identical subsystem 523 is located between the output of the RF-DPD subsytem 510 and switch 508. The gain of this second "unity-gain" subsystem 523 is set by the GPP/DSP software 515 to be equal and opposite to the gain of the first "unity-gain" subsystem thereby ensuring that the input signal entering connector 525 has the same power level as the signal exiting connector 526.

To perform an automatic calibration of the nonlinear response of the amplifier, switch 522 is first set to the right position. Then the GPP or DSP 515 defines a calibration test signal which is digitally generated in the FPGA 512 and converted to an analog RF signal by the DAC 514. This signal passes through the "unity-gain" subsystem 523 through switch 508 in the right position to the input port of the amplifier 504. The output of the amplifier 504 is sampled by the RF tapper 509 and further attenuated or amplified by a third "unity-gain" subsystem 524 to ensure that the signal level is optimal for the input of the ADC 511.

The ADC 511 digitizes the signal and the FPGA 512 captures a snapshot of the amplifier output signal and sends it to the GPP or DSP 515 for processing. The APCO algorithms 516, (examples of which are described below with reference to FIG. 11) which may be implemented in software on the GPP/DSP 515, generate a new predistorted calibration test signal. The output of the amplifier of this new predistorted test signal is then sampled and evaluated in comparison to the original signal. This process is repeated until the optimization algorithms converge on the optimal predistortion coefficients, at which point the calibration process ends. The GPP/DSP 515 sends the optimal polynomial predistortion coefficients to the FPGA 512 and switch 522 is set back to the left position.

Figure 11:
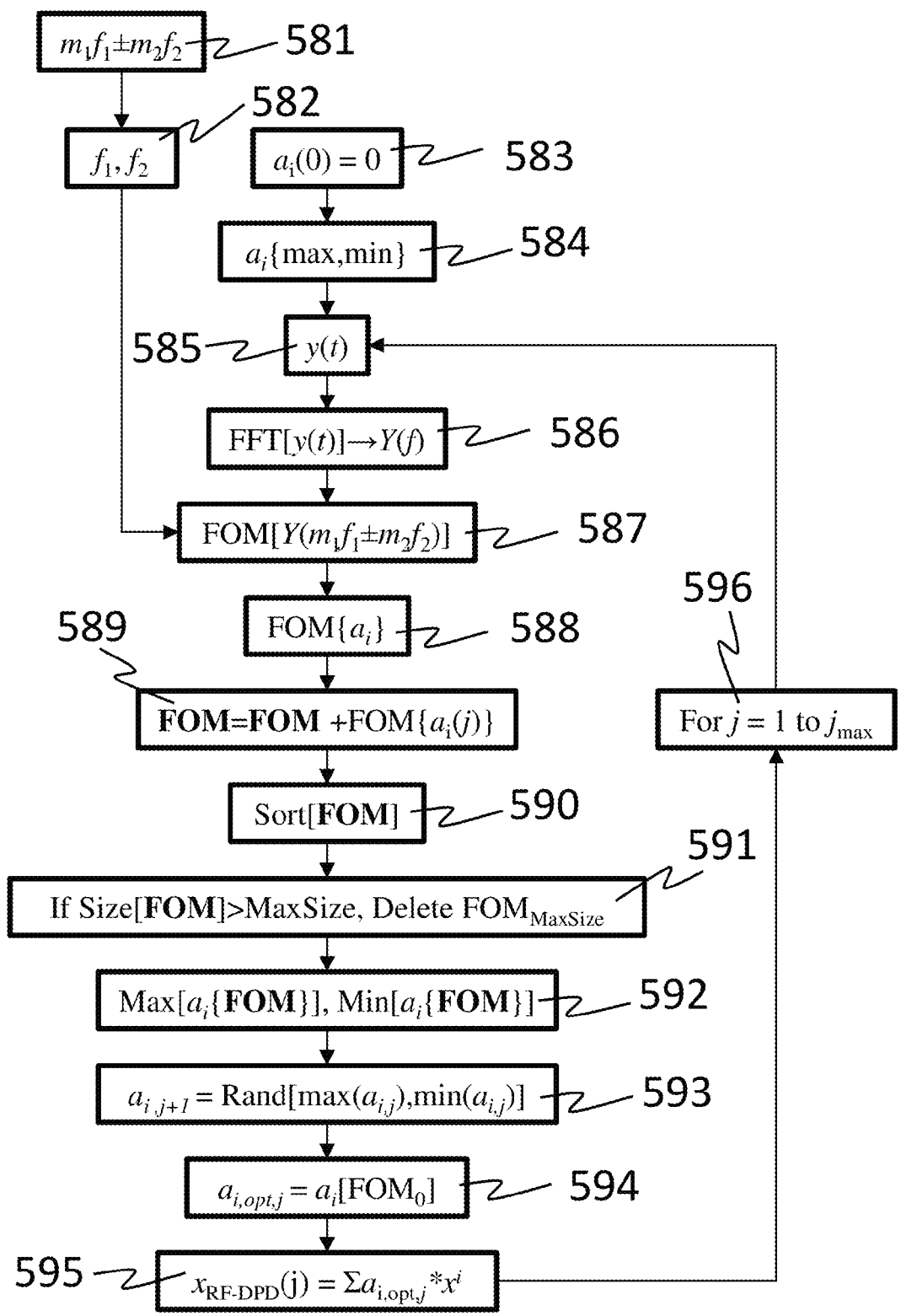
FIG. 11 is a diagram illustrating an APCO optimization algorithm for determining P3ANC nonlinear polynomial model coefficients in accordance with one embodiment of the systems and methods described herein.

FIG. 11 is a diagram illustrating an APCO optimization algorithm for determining nonlinear polynomial model coefficients in accordance with one embodiment of the systems and methods described herein. This example algorithm allows the user to target the optimization process toward reduction of specific nonlinear components (i.e. $m_1 f_1 \pm m_2 f_2$, where $f_1$ and $f_2$ are the frequencies of the input signals, and $m_1$ and $m_2$ are integers) or any nonlinear components within a specific frequency range, 581. In this example we consider the input signal to have two dominant components at frequencies $f_1$ and $f_2$, although those skilled in the art will be able to apply this to any number of input signal frequencies, $\{f_1, f_2, \ldots f_k\}$, where k is greater or equal to one. Based on the known frequency or frequencies of the fundamental(s), the algorithm then determines the frequencies of all nonlinear signals to which the optimization should be applied 582.

Next all P3ANC coefficients are initialized to zero (with the exception of the linear term, which is set equal to unity) 583. In addition, an initial range is assigned within which each P3ANC coefficient is expected to fall 584. Next a sample of the amplifier output signal (in response to a calibration signal), y(t), is acquired by the APCO hardware (HW) 585, for example as described with reference to FIG. 10. A power spectrum 586 is obtained by applying a Fast Fourier Transform (FFT) to the acquired data sample, y(t), to obtain the frequency domain representation, Y(f).

A figure of merit (FOM) is then constructed from the spectral power at all of the frequencies ($m_1 f_1 \pm m_2 f_2$) associated with nonlinear signals to be reduced as part of the optimization process 587. The FOM may be chosen such that a high value of the FOM corresponds to a high level of nonlinear signals. For example, in one implementation, the FOM could be the maximum value of the nonlinear signals. In another implementation, the FOM could be the mean value of all the nonlinear signals. This FOM is then associated with the P3ANC coefficients, $a_i$, for this trial, 588. These bundled parameters are then added to an array 589, and the array (FOM) is sorted according to the FOM 590. These bundled parameters are then added to an array 589, and the array (FOM) is sorted from lowest to highest FOM 590. Any commercial-off-the-shelf numerical sorting algorithm can be used to perform the sort.

In order to converge on the optimal P3ANC coefficients in the least number of iterations, the array is cropped if it exceeds a predetermined size 591. For example, in one implementation the total number of iterations is set to 5000, and the maximum size of the array is set to 30. Those skilled in the art will be able to identify other values of the array size and total number of iterations that meet the needs of the application within the processing speed constraints of the hardware on which the algorithm is implemented. If the array size is less than or equal to this maximum array size (30 in the example above) then no elements are removed from the array. If the array size is greater than the maximum allowed, then one element of the array is removed. The element removed is the one with the lowest value for the FOM. In addition, if the array size is greater than the maximum allowed, the range assigned to each P3ANC coefficient is reset. The range is reset by identifying the maximum and minimum values of each coefficient within the array 592 and using these values as the new range limits for each coefficient. The next set of P3ANC coefficients is selected randomly from within this new allowed range of values 593.

The optimal P3ANC coefficients as of the jth iteration, $a_{i,opt,j}$ which are associated with the element within the array with the highest FOM are then selected 594 and applied to the RF-DPD 595. An updated power spectrum and FOM is obtained and the entire process is repeated until the maximum number of iterations $j_{max}$ (5000 in the above example) is reached 596.

In prior art systems, predistortion and postdistortion are applied in a system to compensate for the nonlinear response of components internal to the system, (e.g. the local power amplifier within a transmitter, or the local LNA within a receiver). One of the non-obvious aspects of ISRFMS is that, in addition to both those cases, it can also be applied as a postdistortion on a receiver to compensate for the nonlinear response of components external to the system (in the above example, a power amplifier on a remote transmitter). This feature of ISRFMS may be referred to herein as Remote Transmitter Impairments Compensated Locally (RTICL).

Figure 12:
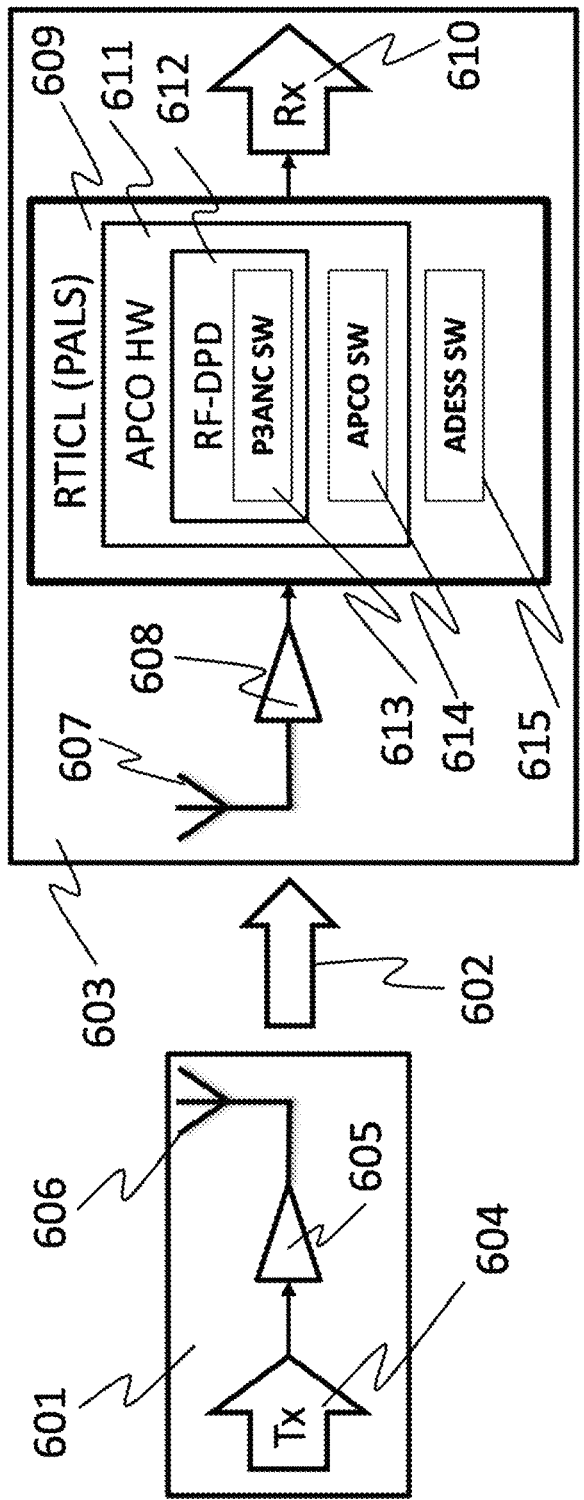
FIG. 12 illustrates an example of a wireless RF transmitter and receiver with the ISRFMS Remote Transmitter Impairments Compensated Locally (RTICL) on the receiver.

FIG. 12 illustrates an example of a wireless RF transmitter and receiver with the ISRFMS Remote Transmitter Impairments Compensated Locally (RTICL) on the receiver. Particularly, FIG. 12 shows an example of the RTICL concept applied to a remote transmitter 601 and a local receiver 603 with a FMS RTICL subsystem 609. The remote transmitter 601 generates an RF transmit signal 604, then amplifies the signal with a power amplifier 605 that has a nonlinear response and broadcasts the signal over the air with a transmit antenna 606. A power amplifier is used as an example of a component that generates a strong nonlinear component when operated near its P1 dB, but as noted previously, embodiments can be applied to nonlinearities arising from any number of components in the RF chain.

The RF signal is transmitted over the air 602 until it arrives at the ISRFMS-enabled RF receiver 603. Here the signal is received by an antenna 607, amplified by an LNA 608, and processed by the FMS RTICL subsystem 609 to reduce the nonlinearity in the received signal prior to signal recovery 610. The RTICL subsystem is based on an implementation of the APCO hardware 611 (described with reference to FIG. 10) with RF-DPD 612 containing P3ANC software 613 (described with reference to FIG. 11) operating as postdistortion in the receive mode. The addition of software for adaptive exfiltration of spectral signals (ADESS) 615 enables the RTICL subsystem to identify the remote high-powered signals that should be the object of the nonlinear compensation.

Figure 13:
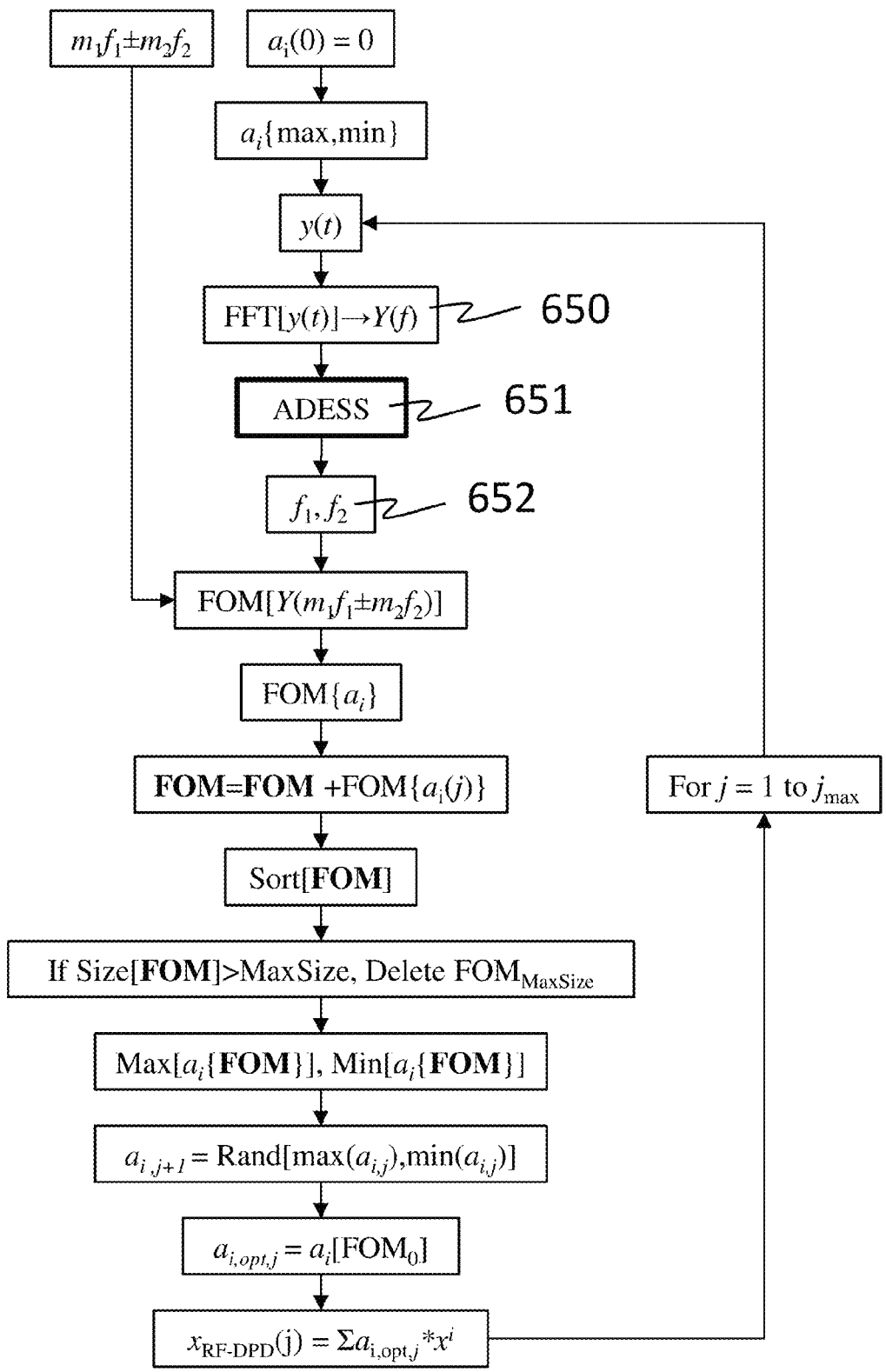
FIG. 13 illustrates an example RTICL algorithm based on APCO with the addition of ADESS spectral peak determination in accordance with one embodiment of the technology described herein.

FIG. 13 illustrates an example RTICL algorithm based on APCO with the addition of spectral peak determination in accordance with one embodiment of the technology described herein. This example shows the RTICL algorithm, which is based on the APCO algorithm (described with reference to FIG. 11), with an additional step 650 where the ADESS algorithm 651 (described below with reference to FIG. 14) is applied to the power spectrum measured by the receiver in order to identify frequencies of the highest power signals 652, for which nonlinear signals are to be reduced. One way to detect radio frequency signals would be to apply a peak-fitting algorithm to all data above a specified threshold. However, radio frequency signals have very diverse spectral characteristics, and in many cases a simple peak-fitting algorithm may not yield a useful representation of the actual signal characteristics. In addition, signals may have overlapping frequency ranges, and simple peak-fitting would not detect these overlapping signals. Accordingly, in some embodiments the ADESS process can be applied to identify nonlinear signals of interest.

Figure 14:
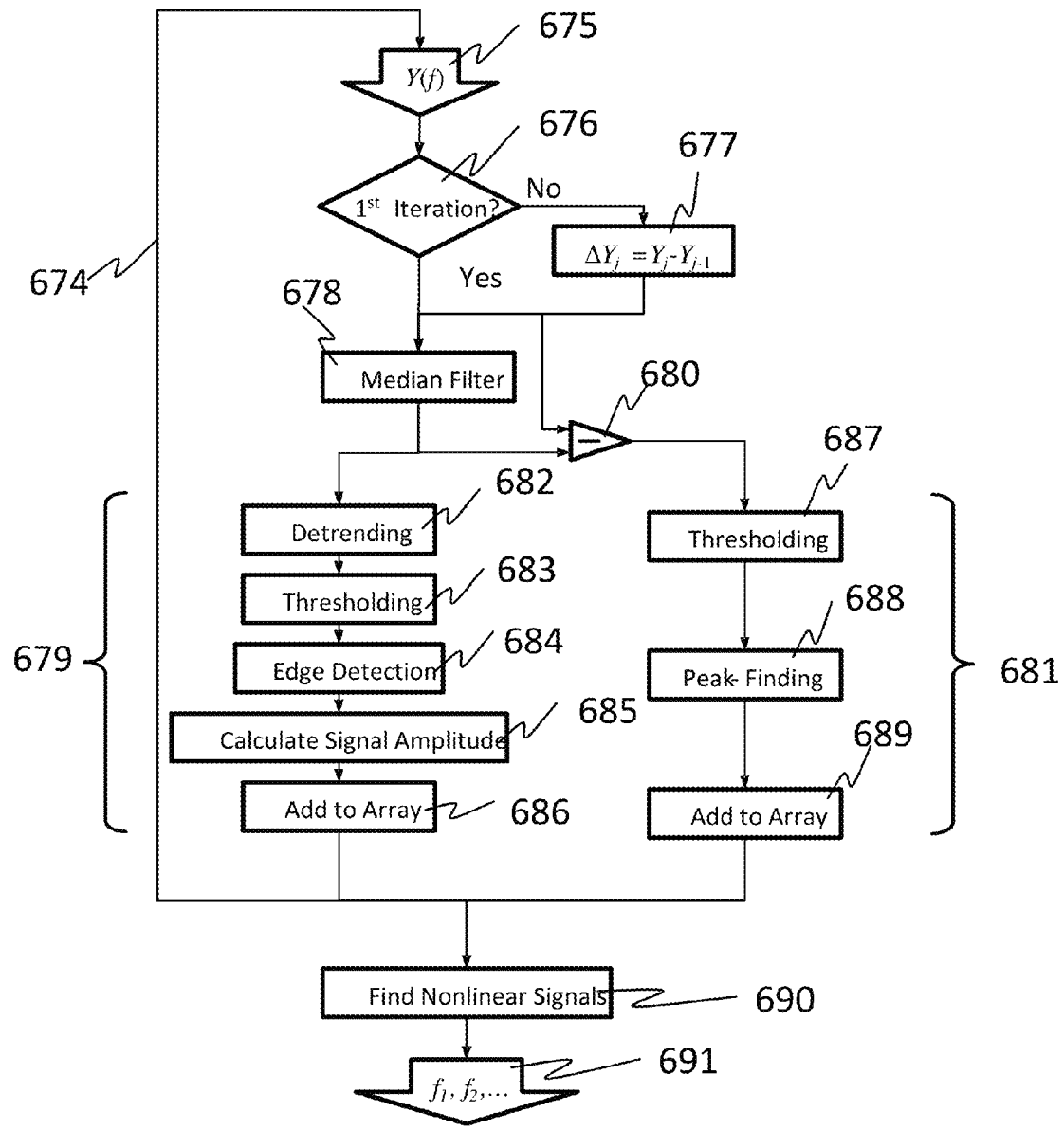
FIG. 14 illustrates an example ADESS algorithm for identification of the remote nonlinear signals of interest in accordance with one embodiment of the systems and methods described herein.
Figure 15:
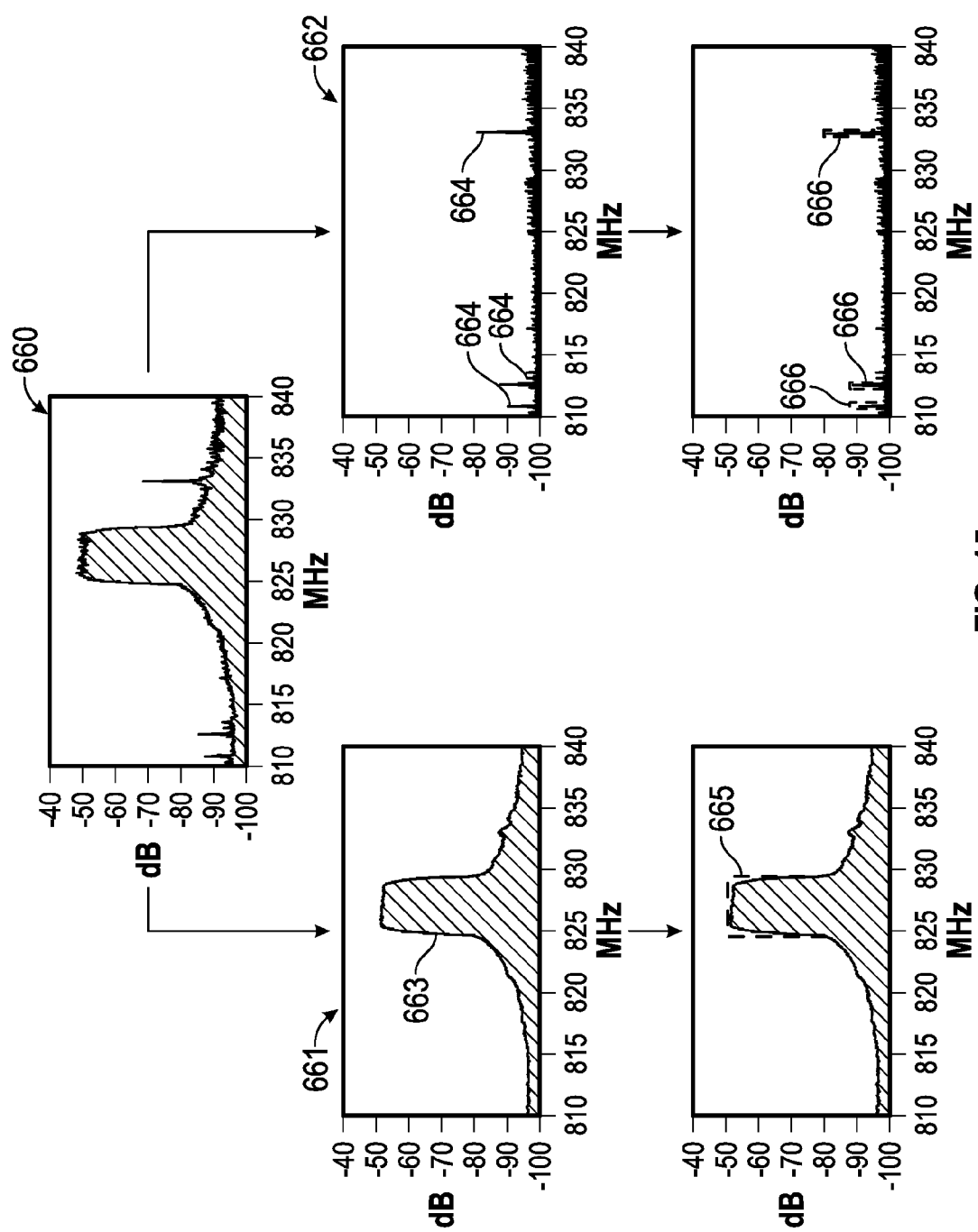
FIG. 15 is a diagram illustrating examples of wideband and narrowband signals.

One example of the ADESS algorithm for identification of the remote nonlinear signals of interest is shown in FIG. 14. FIG. 15 illustrates examples of the frequency spectra at various steps in the ADESS process. Generally speaking, the ADESS algorithm is a spectral detection process that determines radio frequency spectral data and extracts radio frequency signal parameters from the spectral data. The example process illustrated in FIG. 14 uses measured spectral data of two types: wideband spectral data and narrowband spectral data. Because radiofrequency signals can have diverse spectral characteristics, looking at both wideband and narrowband data can avoid issues that may otherwise arise by simply applying a peak-fitting algorithm in an attempt to determine actual signal characteristics. In addition, because signals may have overlapping frequency ranges, a simple peak-fitting algorithm would not detect these overlapping signals. Accordingly, as described below, this example algorithm separates the measured spectral data into wideband and narrowband components and applies distinct signal detection methods to each.

With particular reference now to FIGS. 14 and 15, the example algorithm performs multiple iterations 674 of spectral data collection and exfiltration in order to build up a database of signals in the environment, out of which the center frequencies, bandwidths, and signal strengths of the remote nonlinear signals of interest are identified. Multiple iterations are performed in order to capture any short-duration signals in the environment that may otherwise be missed. The number of iterations can be determined by those skilled in the art based on the specific hardware performance parameters and requirements of the application. For example, if the nonlinear signals of interest are known to be continuous emitters, then one iteration may be sufficient to identify the frequencies of these signals. Where short duration signals of interest may be present, multiple iterations can be used to increase the likelihood of capturing those signals as well.

Once incoming spectral data, Y(f), 660 is received by the ADESS algorithm 675, a decision tree 676 evaluates the number of iterations performed within this instantiation of the ADESS algorithm. If this is the first iteration, the spectral data 660 is sent to a median filter 678. Median filter 678 separates out wideband spectral content 661 from the narrowband spectral content 662 so that distinct signal detection mechanisms can be applied to each. In some embodiments, narrowband signals are defined as those whose bandwidth is comparable to the spectral resolution of the receiver (e.g. bandwidth less than 10 times the spectral resolution), and wideband signals as those whose bandwidth exceeds this. The exact frequency that separates narrowband from wideband can be controlled by a parameter of the median filter, and can be chosen to meet the requirements of the application by those skilled in the art.

One reason for separating the spectral data this way is because the spectral shape of narrowband and wideband signals is sufficiently different so that using separate thresholding and detection algorithms for narrowband and wideband signals may significantly improve the signal detection rate. Using the median filter allows these two detection algorithms to be implemented in parallel, which as a result allows detection of overlapping signals in the same portion of the frequency spectrum. Narrowband signals show up as narrow peaks 664 that can be well approximated by a Lorentzian and can therefore be reliably detected 666 using a peak detection process 681. Wideband signals (e.g., 663), on the other hand, show more structure, often with flat-top spectral signatures. In this case, conventional peak-detection algorithms, which typically assume a Gaussian or Lorentzian shape for the peak, are less reliable. Accordingly, in various embodiments, the ADESS algorithm incorporates an edge-detection, or trigger, algorithm, in which the bandwidth and center frequency of a wideband a signal 665 are determined from the separation of neighboring rising and falling edges by edge-detection in a wideband signal process 679. Particularly, the algorithm can be configured to detect the rising and falling edges of each wideband signal, and determine the center frequency from the mean value of the frequency at the rising and falling edges. The signal amplitude can be determined from the mean value of the spectral power between the rising edge and the falling edge of the signal.

The wideband signal process 679 begins by detrending 682 the spectral data to eliminate frequency variations in the noise floor. Next, an adaptive thresholding algorithm is applied 683 that performs a statistical analysis of the detrended spectral data to establish the level of the noise floor. The threshold is then based on a combination of these statistical parameters. For example, in one implementation, the threshold could be set to be three standard deviations above the mean. This implementation could be suitable for environments with low signal content, where the statistical mean of the entire spectral dataset corresponds closely to the mean value of the noise floor of the dataset. In another implementation, the threshold could be determined by performing a peak-finding analysis on a histogram of spectral values in the dataset. If more than one peak is found, the peak with the lowest mean value is identified as the mean value of the noise, and the threshold is set to three peak-widths above this mean value. This implementation may be effective in environments where there is a high density of signals, and the statistical mean of the entire dataset does not correspond closely to the mean value of the noise floor of the dataset.

The threshold determined from the thresholding algorithm is used as an input parameter of the edge detection algorithm 684. The edge detection algorithm identifies wideband signals by consecutive rising and falling edges. Next the amplitude of each signal is determined by amplitude determination algorithm 685, which computes the average value of the spectral signal between the rising and falling edge of the signal.

The detected signal information (center frequency bandwidth and amplitude) is tagged with any other identifiers (e.g. timestamp, location, direction of arrival) and added to a running array of all detected signal content at 686.

The narrowband signal content is obtained by subtracting 680 the wideband output of the median filter from the input to the median filter 678. The narrowband signal processing 681 includes the same adaptive thresholding algorithm 687 followed by a peak-finding algorithm 688 that fits a Lorentzian, Gaussian, or similar curve to the spectral data in order to identify, frequency, bandwidth and amplitude of the spectral signal content. The narrowband signal content is also tagged with any other identifiers and added to the running array of detected signal content 689, and the signal detection is repeated with another spectral data sample 674.

Once the final iteration is reached, the list of signals in the array is searched to find nonlinear signals of interest 690. One approach to finding nonlinear signals is to sort the array according to amplitude, and identify the highest amplitude signals as those most likely to generate nonlinear spurious signals. Another more reliable approach to finding nonlinear signals is to first identify the highest amplitude signals, as above, then search for signals at harmonics and/or IMPs of these signal frequencies. The output of the ADESS algorithm is a set of fundamental frequencies ($f_1$, $f_2$, . . . ) 691 for which nonlinear spurious signals can be reduced.

Spectral detection using the ADESS algorithm can be used to detect nonlinearities not only from within the communication system, but from external interference sources as well. Examining the spectrum to identify spurious signals can allow nonlinearities from remote sources to be detected and addressed. In some embodiments, for example, the system can be configured to look for the highest power signal, and then to identify harmonics of the highest power signal. Those harmonics are generally unwanted interference signals that can be addressed by compensation. This process can continue for lower power signals and their harmonics to identify other interfering signals. Signals that are detected at frequencies outside of the frequency band in which the system is operating (which band or band width can be adjusted to compensate for Doppler and other effects) can be identified as interfering signals.

The ADESS algorithm can be used to compress spectral data with diverse spectral characteristics, as shown in Table 1. The ADESS algorithm contains many internal control parameters that may need to be adjusted for optimal performance of the algorithm in a specific environment.

TABLE 1

ZOOLOGY OF SPECTRAL DATA

| Signal Type | Signature | Hardware Remedy | Software Remedy |
| --- | --- | --- | --- |
| Narrowband Signals | High spectral (frequency) resolution | High memory capacity of processor | Long sampling time |
| Wideband Signals | Large bandwidth | High sampling rate of digitizer | High-throughput data processing |
| Low Amplitude Signals | Low noise floor | High dynamic range and bit resolution of digitizer | Ensemble averaging |
| Pulsed Signals | Short duration, low duty cycle | Real-time "streaming" digitizer and processing | Time-selective ensemble averaging |
| Frequency Agile Signals | Fast frequency changes | Wideband streaming digitizer and processing | Change detection |

Embodiments can further include an optimization process for Compressed Diversified Spectral Data (CDSD). An example of such a process is set forth in Table 2.

TABLE 2

OPTIMIZATION PROCESS

1. Develop software code with tunable control variables.
2. Develop a benchmark test case with which to evaluate and optimize the software code.
3. Develop a figure of merit (FoM) or state variable to quantitatively evaluate the performance of the ADESS algorithms.
4. Apply the ADESS algorithms to the benchmark test case and evaluate the FoM.
5. Automate the evaluation process to obtain the FoM as a function of control variables.
6. Develop an optimization method to obtain the optimal control variables as a function of spectral signal content characteristics.
7. Conduct an analysis of measured data to determine realistic control variable ranges for characteristic signals.
8. Develop a model to select control variables that optimally match the characteristics of the signal environment.
9. Evaluate the performance of the ADESS algorithms with measured data in diverse signal environments.
10. Refine the control variable-selection model based on ADESS performance results.
11. Automate the control variable selection process as a function of real-time changes in the signal environment.

Various embodiments may also be implemented to use binary-sensor theory and Bayesian inference in the CDSD optimization process With the advent of wideband wireless communications hardware (e.g. smartphones, software-defined radios) the frequency spectrum is in greater demand than ever. Traditional wireless communications systems access allocated frequency bands in a static manner, with no adaptability to the environment. However, many studies have shown that large portions of the spectrum are underutilized. See, for example, Matthews, J.; Bukshpun, L.; Pradhan, R. D., "*High-Fidelity Adaptive Compression for Cognitive Spectral Monitoring*," Military Communications Conference, MILCOM 2013-2013 IEEE, vol., no., pp. 1183, 1186, 18-20 Nov. 2013

Next generation wireless communications networks, based on the cognitive radio paradigm, will need to dynamically access and manage spectrum usage to take advantage of these temporary gaps in spectrum occupancy. Key to achieving this goal is dynamic spectrum access (DSA), a process whereby RF users dynamically select available frequencies for transmission/reception from an allocated pool or as secondary users on a not-to-interfere basis.

Two fundamental challenges for any software-defined radio (SDR) system are computational efficient processing of wideband signals and mitigation of nonlinear artifacts from the analog RF front end.

Figure 16:
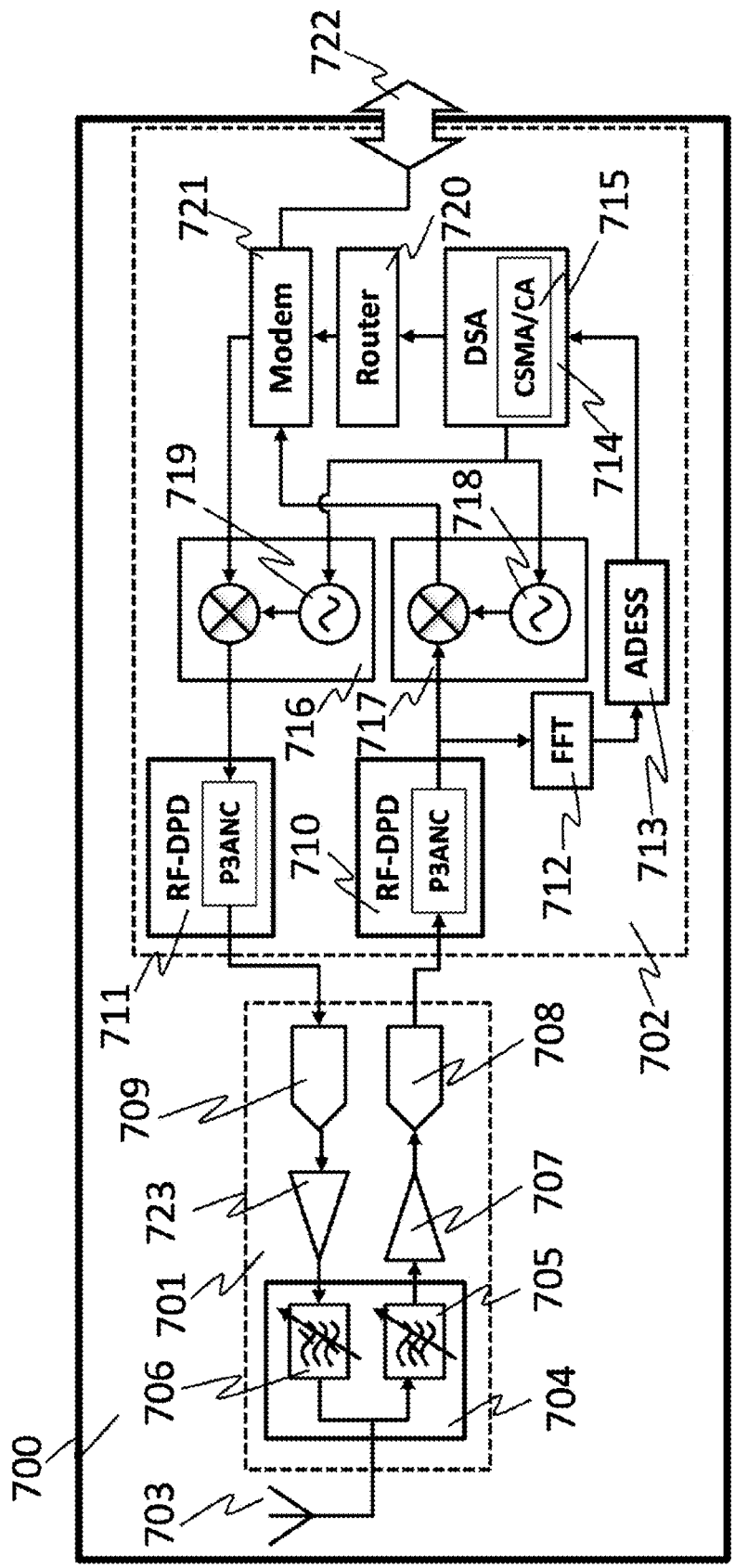
FIG. 16 is an example system architecture of a wideband adaptive intelligent software-defined radio (WAISDR) in accordance with one embodiment of the systems and methods described herein.

Various embodiments of the disclosed technology relate to a system architecture for a Wideband Adaptive Intelligent SDR (WAISDR), an example of which is shown in FIG. 16. In this example, WAISDR 700 integrates the ISRFMS methodology and component algorithms to address the challenges identified in the preceding paragraph.

The WAISDR 700 includes an analog RF front end 701 and a digital backend 702. A wideband (e.g. 10-2000 MHz) RF antenna 703 is used for both transmitting and receiving signals. A wideband duplexer 704 prevents transmitted signals from being coupled directly back into the receiver. The duplexer incorporates two agile filters 705, 706 that can change their center frequency, and/or bandwidth, on the fly, as commanded by the WAISDR digital backend 702. In one implementation, the filter on the transmit side 706 is a bandpass filter, and the filter on the receive side 705 is a bandstop filter with the start and stop frequencies of the transmit side passband and the receive side passband set to be equal. The remaining components of the WAISDR analog RF front end are a wideband (e.g. 10-2000 MHz) LNA 707, a wideband (e.g. 10-2000 MHz) PA 723, a high sampling rate (e.g. 5 GS/s) ADC 708, and a high sampling (e.g. 5 GS/s) DAC 709.

The WAISDR digital backend 702 in this example includes digital signal processing algorithms implemented in real-time (e.g. FPGA ASIC) and/or non-real-time (e.g. GPP DSP) hardware components. Specifically the ISRFMS RF-DPD with P3ANC is implemented as a post-distortion 710 on the streaming digital signal from the ADC 708 and as a predistortion 711 on the streaming digital signal supplied to the DAC 709.

A useful feature for a radio to adapt to the RF environment is the ability to monitor the RF spectrum accurately, in order to allow a DSA system to dynamically assign carrier frequencies for the WAISDR-transmitted radio signals. Spurious signals generated by the LNA or other analog RF components in the receiver can provide false indication to the radio DSA subsystem that channels are occupied, when in fact they are not. By compensating for the nonlinear response of the radio receiver, FMS reduces or minimizes such spurious signals, and enables a more effective DSA operation for the radio.

To monitor the spectrum, WAISDR applies an FFT 712 to the digitized linearized RF receive signal, and generates a power spectrum over the full band, which is processed by the ADESS algorithms 713 (described with reference to FIG. 13) in order to identify the signal content within the operating frequency band (e.g. 10-2000 MHz). This environmental signal data is then processed by the DSA subsystem 714, which includes carrier sense multiple access with collision avoidance (CSMA/CA) algorithms 715. The DSA subsystem 714 performs frequency assignment for the radio transmit and receive channels based on the detected signals in the environment and a spectrum usage policy database. These frequency assignments are used to set the digital carrier frequency generators 718, 719 within the digital downconverter 717 and the digital upconverter 716, respectively, that convert signals between RF and baseband. The baseband signals are processed by a modem 721 that performs physical layer functions such as modulation/demodulation encryption/decryption encoding/decoding spreading/de-spreading; and a router 720 that performs networking functions; and sent to the radio interface 722, which may include audio, video, or data interfaces accessible by the user.

As noted above, the technology disclosed herein is suited for application with communication systems, including communications transmitters and receivers. To provide some context, it is useful to describe an example piece of equipment with which the disclosed technology can be implemented. One such example is that of a piece of equipment that incorporates both wired and wireless communication interfaces such as that shown in FIG. 17. After reading this description, one of ordinary skill in the art will appreciate that the technology disclosed herein can be used with any of a number of different devices or equipment having wireless communication capabilities.

Figure 17:
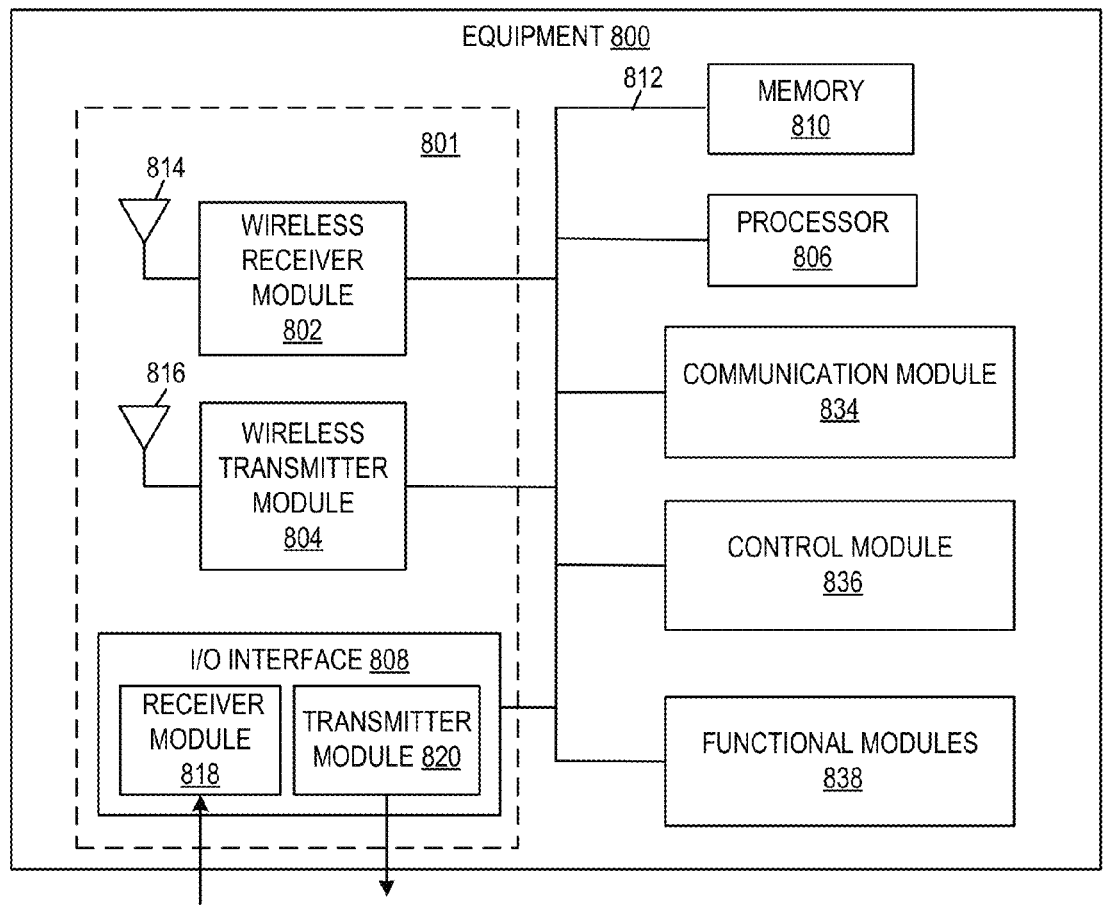
FIG. 17 is a block diagram illustrating one example of equipment with which embodiments of the technology disclosed herein can be implemented.

With reference now to FIG. 17, in this example application, the example equipment 800 includes a communication module 801, a processor 806 (which can include multiple processors or processing units), and memory 810 (which can include memory units or modules of different types). These components are communicatively coupled via a bus 812 over which these modules may exchange and share information and other data. Communication module 801 includes wireless receiver module 802, a wireless transmitter module 804, and an I/O interface module 808.

An antenna 816 is coupled to wireless transmitter module 804 and is used by equipment 800 to transmit radio signals wirelessly to wireless equipment with which it is connected. These outbound RF signals can include information of almost any sort that is sent by equipment 800 to other entities. For example, in the case of a multifunction peripheral (MFP) this can include files representing scanned images or documents, log information, housekeeping information, or other information sent by the MFP relating to its operation. As another example, in the case of a camera, this outbound information can include image files and related data (including metadata) sent by the camera to a computer, printer, or other device.

Antenna 814 is included and coupled to wireless receiver module 802 to allow equipment 800 to receive signals from various wireless terminals within its reception range. Received signals can include information from other equipment used for operation of equipment 800. Continuing with the above two examples, in the case of an MFP, inbound information received by wireless receiver module 802 can include, for example, files to be printed or faxed by the MFP. In the case of a camera, information received could be firmware updates, control information, or other information used by the camera.

Although two antennas are illustrated in this example, one of ordinary skill in the art will understand that various antenna and antenna configurations can be provided as can different quantities of antennas. For example, transmit and receive functions can be accommodated using a common antenna or antenna structure, or separate antennas or antenna structures can be provided for transmit and receive functions as illustrated. In addition, antenna arrays or other groups of multiple antennas or antenna elements, including combinations of passive and active elements, can be used for the transmit and receive functions. The wireless communications implemented using communication module 801 can be implemented according to a number of different wireless protocols, including standardized protocols. Examples of such standardized protocols include Bluetooth®, HiperLan, and various IEEE 802.11 communications standards, although other communication interfaces (whether or not standardized) can be implemented.

An I/O interface module 808 is provided in the illustrated example, and can be configured to couple equipment 800 to other network nodes. These can include nodes or equipment. In this example architecture, the I/O interface module 808 includes a receiver module 818 and a transmitter module 820. Communications via the I/O interface module can be wired or wireless communications, and the transmitter and receiver contained therein can include line drivers and receivers, radios, antennas or other items, as may be appropriate for the given communication interfaces. Transmitter module 820 may be configured to transmit signals that can include voice, data and other communications. These may be sent in a standard network protocol if desired. Receiver module 818 is configured to receive signals from other equipment. These signals can include voice, data and other communications from the other equipment, and can also be received in a standard network protocol if desired. In terms of the above examples of an MFP or digital camera, I/O interface 808 can provide a hardwired complementary interface to the wireless interface described above. This may be, for example, an Ethernet interface, a USB interface, a FireWire interface, or other hardwired interface.

Memory 810, can be made up of one or more modules of one or more different types of memory, and in the illustrated example is configured to store data and other information 824 as well as operational instructions that may be used by the processor to operate equipment 800. The processor 806, which can be implemented as one or more cores, CPUs, DSPs, or other processor units, for example, is configured to execute instructions or routines and to use the data and information in memory 810 in conjunction with the instructions to control the operation of the equipment 800. For example, image-processing routines, such as compression routines, can be stored in memory 810 and used by processor 806 to compress image files from raw files into JPEG files.

Other modules can also be provided with the equipment 800 depending on the equipment's intended function or purpose. A complete list of various additional components and modules would be too lengthy to include, however a few examples are illustrative. For example, a separate communication module 834 can also be provided for the equipment to manage and control communications received from other entities, and to direct received communications as appropriate. Communication module 834 can be configured to manage communication of various information sent to and received from other entities. Communication module 834 can be configured to manage both wired and wireless communications.

A separate control module 836 can be included to control the operation of equipment 800. For example, control module 836 can be configured to implement the features and functionality of equipment 800. Functional modules 838 can also be included to provide equipment functionality. For example, in the case of an MFP, various modules (which may include various forms of hardware and software) can be provided to perform printing, scanning, faxing, and copying operations of the device. In the case of a digital camera, functional modules 838 can include modules such as, for example, optical systems, image capture modules, image processing modules, and so on. In the case of a remote sensor, functional modules can include modules used to perform the sensing and related operations. Again, as these examples illustrate, one of ordinary skill in the art will appreciate how other modules and components can be included with equipment 800 depending on the purpose or objectives of the equipment.

Having thus described an example application, it will become apparent to one of ordinary skill in the art how the invention can be implemented in different and alternative environments and applications.

Figure 18:
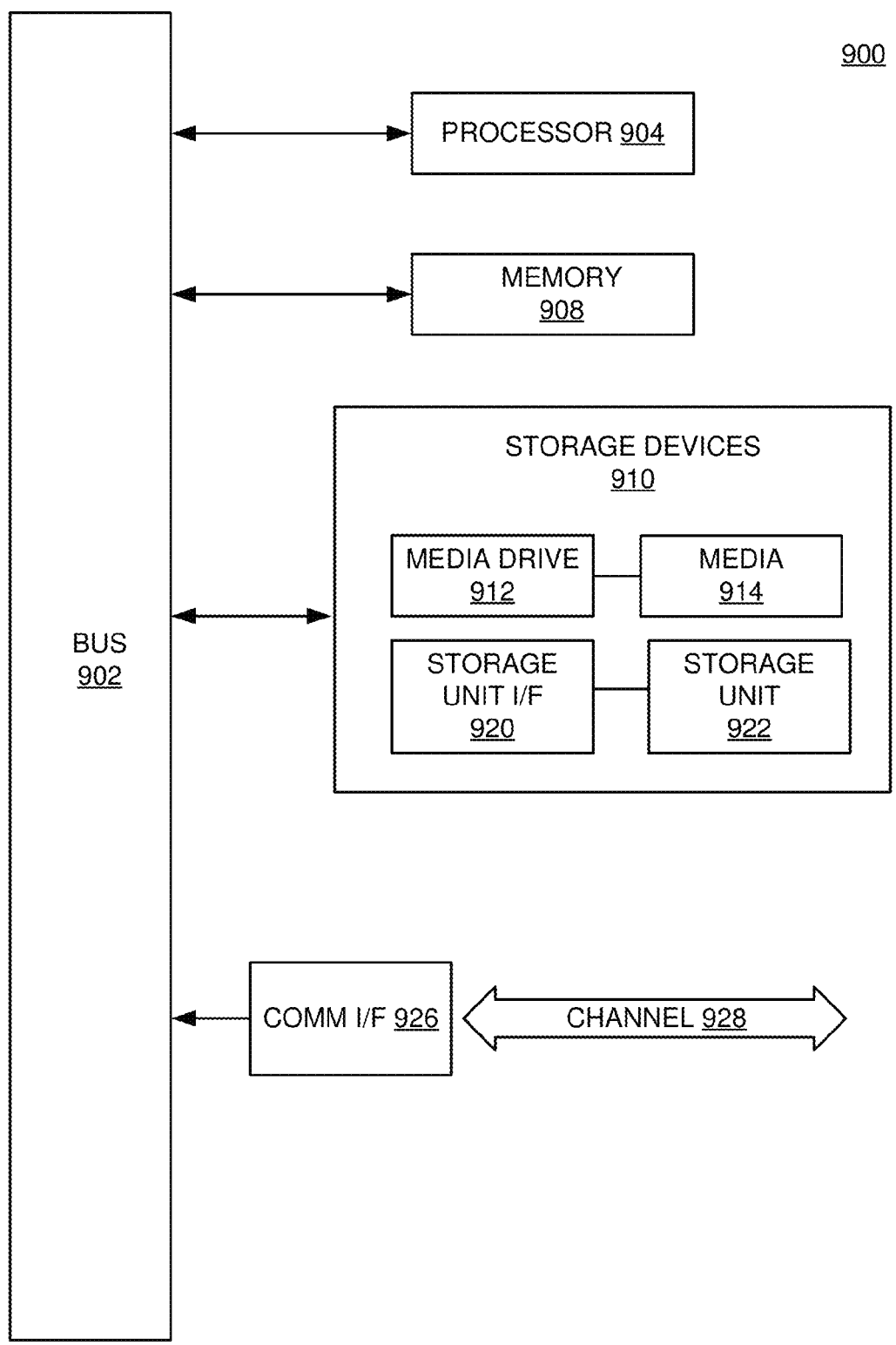
FIG. 18 illustrates an example computing module that may be used in implementing various features of embodiments of the disclosed technology.

As used herein, the term module might describe a given unit of functionality that can be performed in accordance with one or more embodiments of the technology disclosed herein. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the technology are implemented in whole or in part using software, in one embodiment, these software elements can be implemented to operate with a computing or processing module capable of carrying out the functionality described with respect thereto. One such example computing module is shown in FIG. 18. Various embodiments are described in terms of this example-computing module 900. After reading this description, it will become apparent to a person skilled in the relevant art how to implement the technology using other computing modules or architectures.

Referring now to FIG. 18, computing module 900 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 900 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 900 might include, for example, one or more processors, controllers, control modules, or other processing devices, such as a processor 904. Processor 904 might be implemented using a general-purpose or special-purpose processing engine such as, for example, a microprocessor, controller, or other control logic. In the illustrated example, processor 904 is connected to a bus 902, although any communication medium can be used to facilitate interaction with other components of computing module 900 or to communicate externally.

Computing module 900 might also include one or more memory modules, simply referred to herein as main memory 908. For example, preferably random access memory (RAM) or other dynamic memory, might be used for storing information and instructions to be executed by processor 904. Main memory 908 might also be used for storing temporary variables or other intermediate information during execution of instructions to be executed by processor 904. Computing module 900 might likewise include a read only memory ("ROM") or other static storage device coupled to bus 902 for storing static information and instructions for processor 904.

The computing module 900 might also include one or more various forms of information storage mechanism 910, which might include, for example, a media drive 912 and a storage unit interface 920. The media drive 912 might include a drive or other mechanism to support fixed or removable storage media 914. For example, a hard disk drive, a floppy disk drive, a magnetic tape drive, an optical disk drive, a CD or DVD drive (R or RW), or other removable or fixed media drive might be provided. Accordingly, storage media 914 might include, for example, a hard disk, a floppy disk, magnetic tape, cartridge, optical disk, a CD or DVD, or other fixed or removable medium that is read by, written to or accessed by media drive 912. As these examples illustrate, the storage media 914 can include a computer usable storage medium having stored therein computer software or data.

In alternative embodiments, information storage mechanism 910 might include other similar instrumentalities for allowing computer programs or other instructions or data to be loaded into computing module 900. Such instrumentalities might include, for example, a fixed or removable storage unit 922 and an interface 920. Examples of such storage units 922 and interfaces 920 can include a program cartridge and cartridge interface, a removable memory (for example, a flash memory or other removable memory module) and memory slot, a PCMCIA slot and card, and other fixed or removable storage units 922 and interfaces 920 that allow software and data to be transferred from the storage unit 922 to computing module 900.

Computing module 900 might also include a communications interface 924. Communications interface 924 might be used to allow software and data to be transferred between computing module 900 and external devices. Examples of communications interface 924 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 924 might typically be carried on signals, which can be electronic, electromagnetic (which includes optical) or other signals capable of being exchanged by a given communications interface 924. These signals might be provided to communications interface 924 via a channel 928. This channel 928 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 908, storage unit 920, media 914, and channel 928. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 900 to perform features or functions of the disclosed technology as discussed herein.

Figure 19:
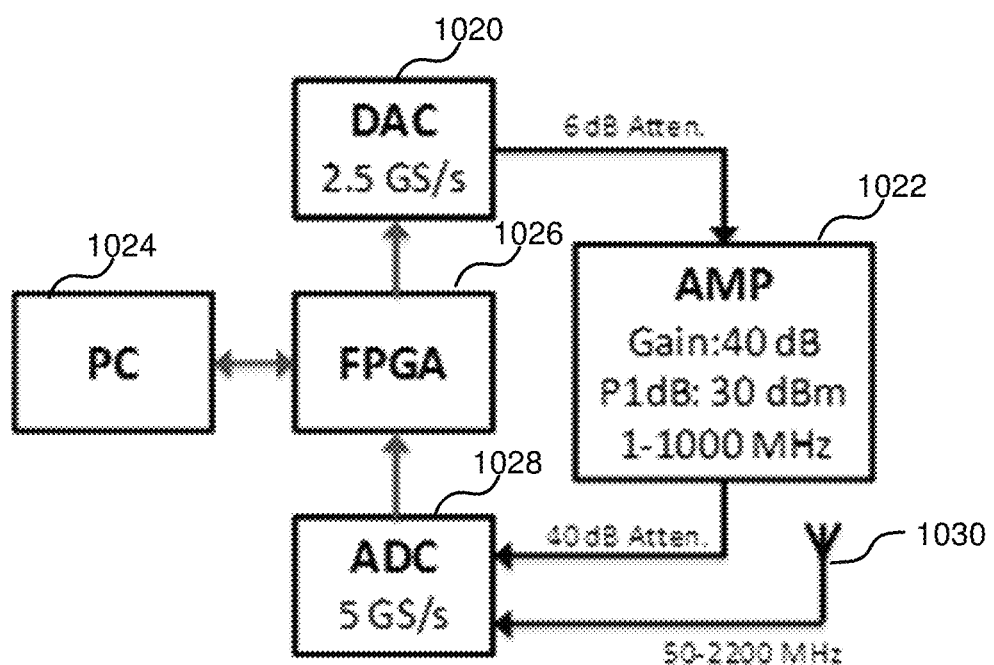
FIG. 19 shows a test set up configured to evaluate the capabilities of digital RF predistortion with wideband complex signal sets.

A test set up was configured to evaluate the capabilities of digital RF predistortion with wideband complex signal sets. This test is set up included a wideband RF transmitter and receiver, signal processing hardware, and a wideband RF amplifier. The main components of the setup, and their interaction, are shown in FIG. 19. This setup includes an FPGA 1026 to implement the ISRFMS. For the test, RF test signals were generated in software on a standard personal computer (PC) 1024. These test signals were output continuously from a digital-to-analog-converter (DAC) 1020, and supplied to the input port of an RF amplifier (AMP) 1022. The output of the amplifier 1022 was then digitized by an analog-to-digital converter (ADC) 1028 and processed by software on the PC 1024. A FPGA provides the digital interface for the ADC and DAC to the PC, and also implements the nonlinear compensation algorithm. For the measurements described below, a broadband antenna 1030 was coupled into the ADC analog RF input port in order to provide access to ambient RF signals. RF attenuators were placed between the DAC and the amplifier, and the amplifier and the ADC, in order to ensure that the full dynamic range of the ADC and DAC was used, but neither was operated close to their saturation point, so as not to introduce nonlinearities from the mixed signal components into the measurement.

Commercially available, high-speed DAC and ADC modules were used in the test set up to provide wide bandwidth transmit and receive capabilities. The DAC 1020 in one embodiment has a 14-bit resolution and a 5.6 GSPS sampling rate. For the measurements, it was operated at 2.4576 GSPS; with a Nyquist bandwidth of 1.2288 GHz. Software-generated test signals supplied to the ADC were 16384 samples long, which at the operated sampling rate corresponded to 6.7 µs duration, which in turn is equivalent to 150 kHz frequency resolution. The ADC in one embodiment has a 10-bit vertical resolution and a 5 GSPS sampling rate, which corresponds to a Nyquist bandwidth of 2.5 GHz. Up to 524,288 samples were collected by the ADC at each iteration, which at 5 GSPS corresponded to 105 µs, which in turn is equivalent to a frequency resolution below 10 kHz.

The amplifier in one embodiment is a you 1 W amplifier (Gain=40 dB, P1 dB=30 dBm, IP3=40 dBm, Bandwidth=1-1000 MHz, Power Consumption=4.3 W) in the test setup. The input to the amplifier was attenuated by 6 dB, while the output of the amplifier was attenuated by 40 dB.

The nonlinear compensation could be implemented in a variety of ways including: as a software predistortion of the test signal supplied by the PC to the DAC; as a firmware "postdistortion" on the FPGA with data collected from the ADC; as a software postdistortion on the PC.

While the first implementation (software predistortion) was the primary objective of the investigation, the latter (software postdistortion) was used to determine the parameter values for the nonlinear compensation, since this could be conducted most effectively in software-only loops. The second implementation listed (FPGA postdistortion) was used to validate the feasibility of implementing the nonlinear compensation in FPGA firmware at these data rates. The testbed used a polynomial function for the nonlinear compensation, with up to five free parameters. By monitoring the output of the amplifier, the nonlinear compensation parameter values that minimize spurious signals within a predefined frequency range were determined.

Figure 20:
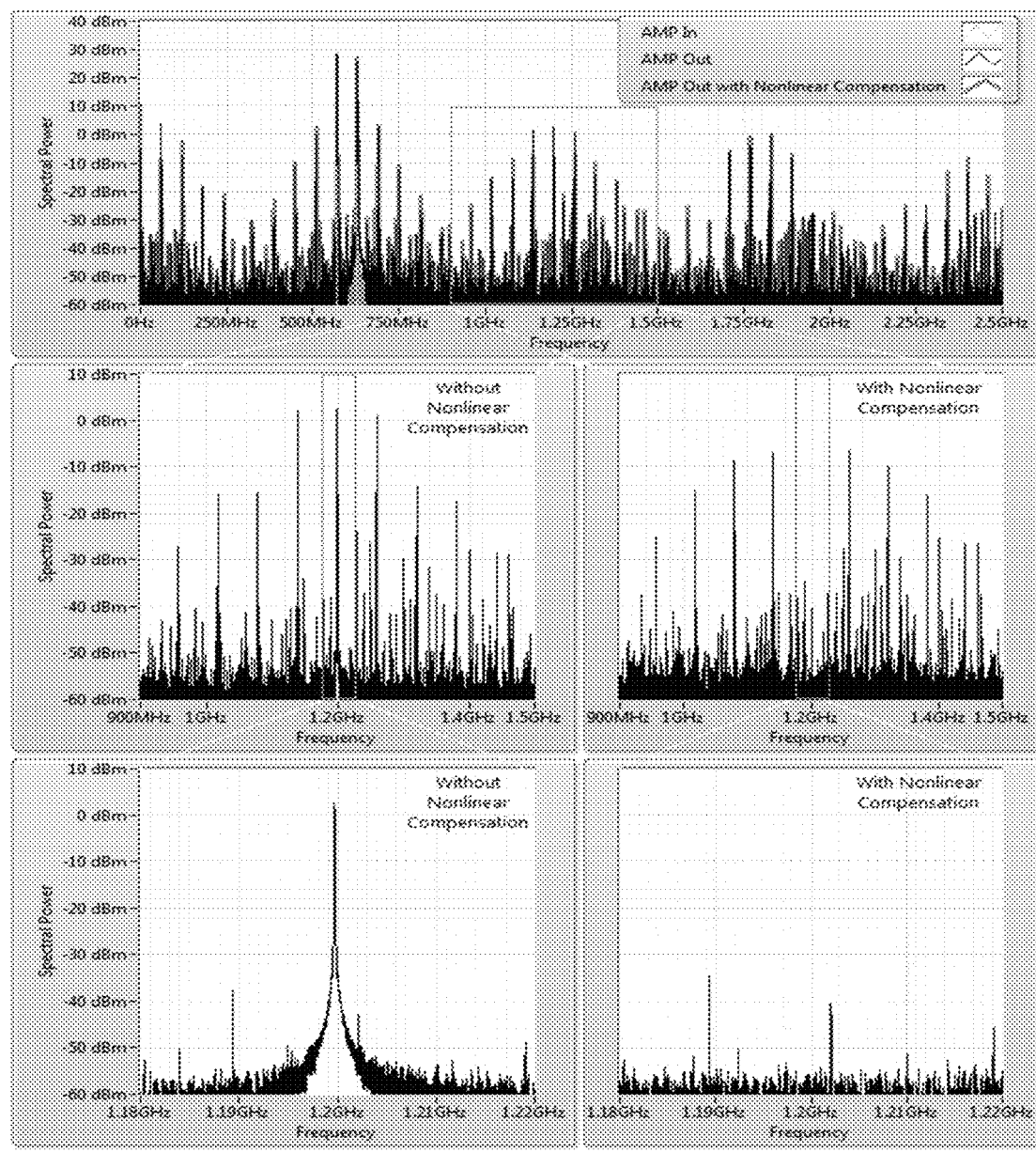
FIG. 20 shows an example of a measurement with a two-tone signal (569.55 MHz and 630.15 MHz).

FIG. 20 shows an example of a measurement with a two-tone signal (569.55 MHz and 630.15 MHz). The amplitude of the input tones were set to be close to the P1 dB of the amplifier, about 30 dBm, which resulted in numerous harmonics and IMP detectable above the noise floor within the frequency range of the receiver (0-2.5 GHz). In this case, the nonlinear compensation function was targeted to reduce one of the largest spurs; the f1+f2 spur at about 1.2 GHz. The topmost plot shows the original spectrum (narrow black lines) and the spectrum with the nonlinear compensation applied (thick grey lines). Shown below this are zoomed in plots of the reduced spur. Note that the spur is reduced below the noise floor, which corresponds to a reduction of more than 60 dB.

Figure 21:
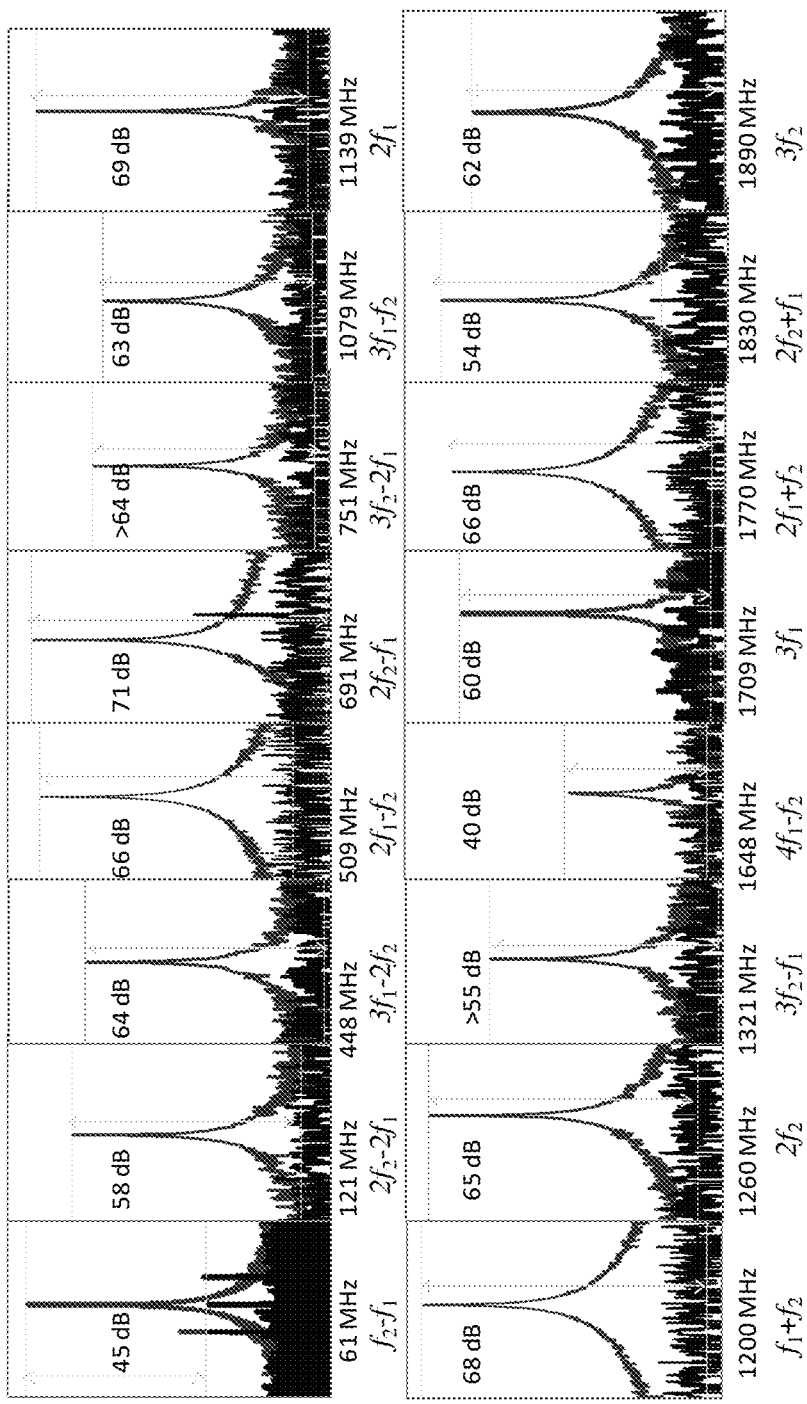
FIG. 21 shows measured results of the reduction of individual spurs between 50 MHz and 2 GHz using nonlinear compensation functions targeted for each spur in turn.

Similar reductions were performed for all spurs individually, which in some cases resulted in as much as 70 dB reduction. FIG. 21 shows measured results of the reduction of individual spurs between 50 MHz and 2 GHz using nonlinear compensation functions targeted for each spur in turn. All spurs were reduced below the noise floor, except the lowest frequency spur (f2−f1), which was reduced by 45 dB. The measured dB reduction of each spur is shown as well as the center frequency and the relation to the two fundamental tones. The original signal is shown in black, the compensated signal in grey.

Since the digital RF predistortion operates on the signal entering the amplifier, it directly compensates for the nonlinear distortion of the amplifier. This implies that the performance should be signal agnostic, provided the signal content lies within the operating bandwidth. To verify this, we used the two-tone signal described above to generate a nonlinear compensation function optimized for reduction of in-band IMP. This nonlinear compensation was then applied as a PC-based predistortion, to two wideband waveforms (300 MHz bandwidth) centered on 600 MHz. The results for a periodic random noise (PRN) waveform and a carrier-suppressed, amplitude-modulated, double-sideband (AM-DSB) waveform are shown in FIG. 21.

Figure 22:
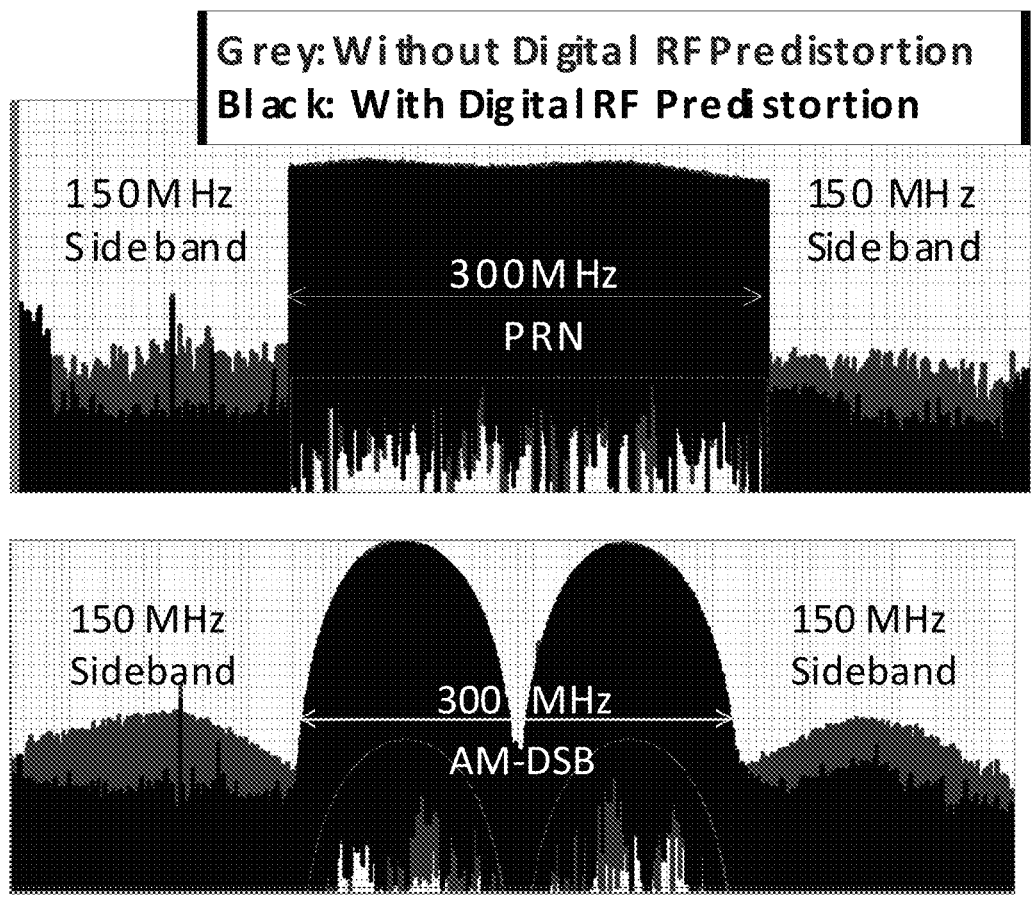
FIG. 22 shows improvement in nonlinear sidebands of a 300 MHz bandwidth periodic random noise (PRN) signal (top) and amplitude modulated, double sideband (AM-DSB), carrier suppressed signal (top), implemented via PC-based predistortion using the same nonlinear compensation function.

FIG. 22 shows improvement in nonlinear sidebands of a 300 MHz bandwidth periodic random noise (PRN) signal (top) and amplitude modulated, double sideband (AM-DSB), carrier suppressed signal (top), implemented via PC-based predistortion using the same nonlinear compensation function. Note that, despite the completely different characteristics and spectral content of the signals in FIG. 21, the nonlinear compensation has comparable effectiveness, i.e., it does not need to know the details of the signal content to successfully mitigate the nonlinear components of the signal.

As seen in FIG. 22, there are low power narrowband signals in the 50-300 MHz band, which become visible after the nonlinear compensation has been applied; whereas without it they previously were largely buried under the nonlinear sideband. This has significant potential benefits for mitigation of cosite interference. To further illustrate this, a 2:1 RF coupler was used to couple ambient RF signals from an antenna with the software-generated test signals from the test setup.

This setup was then used to emulate a jamming scenario. In the scenario, enemy forces, for example, attempt to remotely activate an explosive device using a cellular phone. Friendly forces then turn on a jammer to jam the cellular phone bands (e.g. 450-750 MHz) and prevent the explosive device from being activated. Unfortunately, the jammer (which uses a wideband high-power amplifier at full capacity) generates nonlinear sidebands which interfere with co-located friendly communications (for example in the SATCOM band 240-400 MHz). To mitigate this cosite interference problem, the jammer turns on nonlinear compensation which reduces the sidebands and allows friendly communications to continue.

Figure 23:
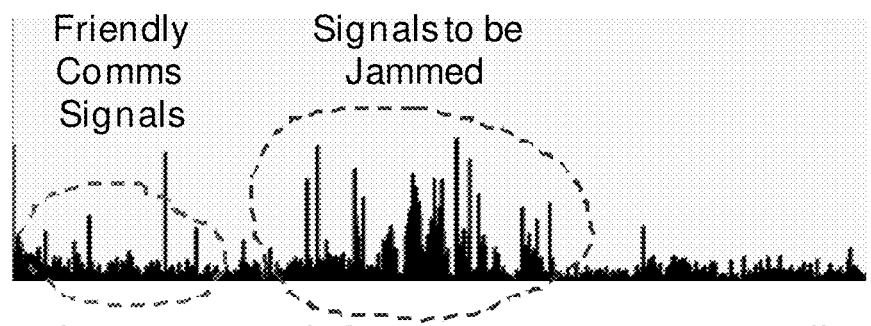
FIG. 23 illustrates the mitigation of cosite interference between a measured signal (wideband AM-DSB) emulating a jammer, and measured ambient signals representing friendly and non-friendly communications signals.
Figure 23:
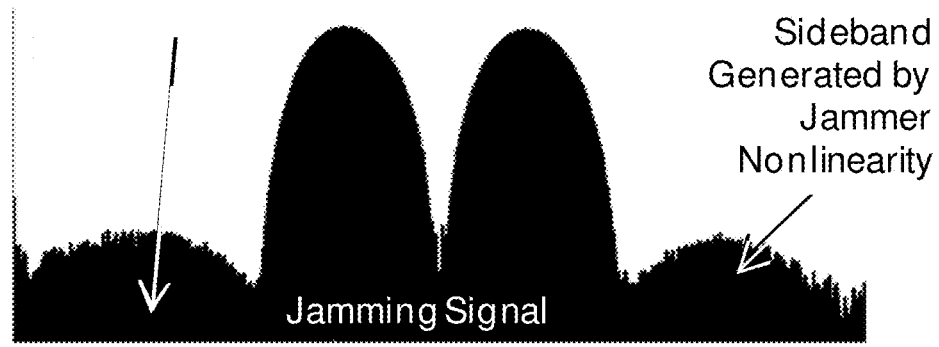
Figure 23:
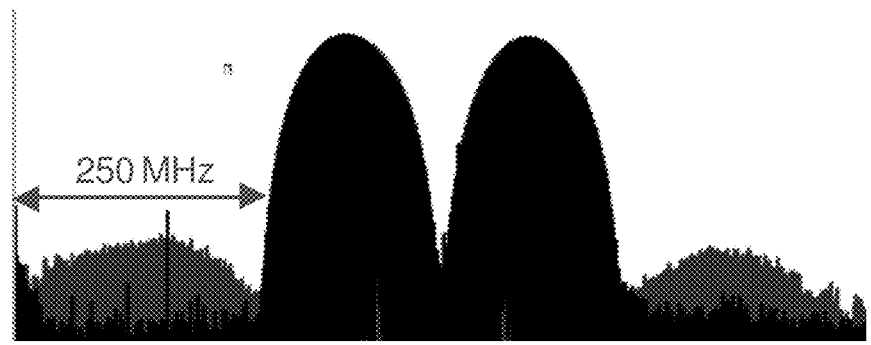

FIG. 23 illustrates the mitigation of cosite interference between a measured signal (wideband AM-DSB) emulating a jammer, and measured ambient signals representing friendly and non-friendly communications signals. The top spectral plot (which ranges from about 200 MHz to 900 MHz shows measured ambient signals. In the center figure a large AM-DSB signal has been turned on and coupled into the receiver along with the ambient signals. In the lower figure, digital RF predistortion has been applied to the AM-DSB signal, which reduces the nonlinear sidebands. The original AM-DSB signal is shown in grey for reference.

Measurements of the ambient RF spectrum (shown at top) reveal a high density of signals in the cellular bands between about 450 MHz and 750 MHz. These will represent the enemy signals to be jammed in our test scenario. There are also some narrowband signals visible at lower frequency—these will represent the friendly communications signals. To emulate the jamming signal, we used the 300 MHz-wide AM-DSB signal described previously. It effectively dominates the cellular signals, effectively jamming the receiver in this band. The nonlinear sidebands also hide the signals representing friendly communications, until, as shown in the lower segment of FIG. 23, the nonlinear compensation is turned on and the sidebands are reduced, allowing the receiver to pick up friendly communications signals with the jammer still operating effectively in the cellular phone band.

These tests help to demonstrate the benefits of digital RF predistortion for compensating for nonlinear effects of the amplifier in an RF transmission system, including versatility of integration with high power transmitters, signal agnosticism, and capability for handling complex wideband signal sets. Also presented are measurements with a 2.5 GHz bandwidth test setup (including both transmit and receive components) that showed up to 70 dB reduction in individual nonlinear spurious signals. The signal agnostic feature of the approach was demonstrated by applying the digital RF predistortion to 300 MHz-wide AM and PRN signals using a common nonlinear compensation function. Finally, the benefits for cosite interference mitigation were demonstrated by emulating a jamming scenario with our testbed and showing how unintentional jamming of friendly signals can be prevented using this digital RF predistortion approach.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A radio frequency ("RF") communication system comprising:
   a radio transmitter comprising an RF power amplifier, the RF power amplifier including an input to receive an RF signal for transmission and being configured to amplify the RF signal for transmission across a communication channel;
   an integrative software radio frequency management system configured to compensate for nonlinearity of the RF communication system by operating on the RF signal entering or exiting the amplifier and;
   an RF digital pre- or post-distortion module comprising:
      a parallel pipelined polynomial module for non-linear compensation; and
      an automated polynomial coefficient optimizer configured to adjust coefficients applied by the parallel pipelined polynomial module based on changes in the nonlinear response of the RF communication system.

2. The RF communication system of claim 1, wherein the RF digital pre- or post-distortion module is configured to generate an inverse RF signal of the nonlinearity based on a mathematical model of the nonlinear response of the RF communication system, and to apply the inverse RF signal to the input signal of the power amplifier to cancel out some or all of the nonlinearity of the RF communication system.

3. The RF communication system of claim 2, wherein the mathematical model used to compensate for the nonlinearity is a polynomial in the value (x) and time-derivative (dx/dt) of the amplifier input signal and individual terms in the polynomial are chosen such that, for an input signal varying sinusoidally with time, an output signal is generated that contains both in-phase and 90 degrees out-of-phase with the input signal at all harmonic orders of interest, wherein:
   if more than one polynomial term provides redundant harmonic content, only one of the polynomial terms is retained in the model;
   when a choice of multiple polynomial terms is available the lowest order polynomial term will be selected for inclusion in the model;
   when a choice of multiple polynomial terms is available polynomial terms with fewer dx/dt products will be favored; and
   the minimal number of terms will be included in the polynomial to provide the necessary reduction of non-linear signal content in the output signal.

4. The RF communication system of claim 1, wherein the parallel pipelined polynomial module comprises a plurality of sets of an integer number of polynomial operators, the polynomial operators comprising a combination of one or more adders and a multipliers arranged serially such that an integer number of polynomial coefficients are applied to a digital representation of the RF signal, one at a time, each occurring at a unique one of an integer number of clock cycles.

5. The RF communication system of claim 1, wherein the RF digital pre- or post-distortion module further comprises: an analog-to-digital converter including an input coupled to receive input information signal, and an output coupled to the parallel pipelined polynomial module; and a digital-to-analog converter including an input coupled to an output of the parallel pipelined polynomial module and an output coupled to the RF power amplifier.

6. The RF communication system of claim 1, wherein a polynomial applied by the parallel pipelined polynomial module comprises:

$$y = a_0 + a_1 x + a_2 x^2 + a_3 x^3 + a_4 x^4 + a_5 x^5 + a_6 x^6$$

wherein coefficients $a_0$ through $a_6$ are real-fixed points or floating point.

7. The RF communication system of claim 1, wherein a polynomial applied by the parallel pipelined polynomial module comprises:

$$y = a_0 + a_1 x + a_2 x^2 + a_3 x^3 + a_4 x^4 + a_5 \left(\frac{dx}{dt}\right)^3 + a_6 \left(\frac{dx}{dt}\right)^5$$

wherein coefficients $a_0$ through $a_6$ are real-fixed points or floating point numbers.

8. The RF communication system of claim 1, wherein a polynomial applied by the parallel pipelined polynomial module comprises:

$$y = a_0 + a_1 x + a_2 x^2 + a_3 x^3 + a_4 x^4 + a_5 \left(\frac{dx}{dt}\right)^3 + a_6 x \left(\frac{dx}{dt}\right)$$

wherein coefficients $a_0$ through $a_6$ are real-fixed points or floating point numbers.

9. The RF communication system of claim 1, wherein the automated polynomial coefficient optimizer is configured to:
 determine frequencies of nonlinear signals to which the optimization will be applied, the determination based on a known frequency or frequencies of one or more dominant components of the input signal;
 assign an initial range into which coefficients of the polynomial are expected to fall;
 acquire a sample of an output data signal of the power amplifier;
 apply a Fast Fourier Transform (FFT) to the acquired data sample to obtain a frequency domain representation of the data sample;
 construct a figure of merit from a spectral power and all of the frequencies associated with nonlinear signals to be reduced;
 bundle the figure of merit with the polynomial coefficients to create bundled parameters, and add the bundled parameters to an array;
 sort the array according to the figure of merit;
 crop the array if it exceeds a predetermined size;
 reset the range by identifying maximum and minimum values of each coefficient within the array and define new range limits for each coefficient as these maximum and minimum values;
 select a next set of coefficients from within this new allowed range of values;
 identify a first set of optimized coefficients as those associated with the array element with the highest figure of merit; and
 apply this first set of optimized coefficients to the RF digital pre- or post-distortion module.

10. The RF communication system of claim 9, wherein the automated polynomial coefficient optimizer is configured to determine an updated power spectrum and figure of merit for operation with the first set of optimized coefficients and compute a new set of optimized coefficients using these values.

11. The RF communication system of claim 1, wherein the integrative software radio frequency management system comprises a remote impairments compensation module configured to compensate for nonlinearities in received signals generated outside the receiver.

12. The RF communication system of claim 11, wherein the remote impairments compensation module comprises an automated polynomial coefficient optimizer configured to adjust coefficients applied by the parallel pipelined polynomial module based on changes in the nonlinear response of the RF communication system.

13. The RF communication system of claim 12, wherein the automated polynomial coefficient optimizer comprises an RF digital pre- or post-distortion module.

14. The RF communication system of claim 13, wherein the RF digital pre- or post-distortion module comprises a parallel pipelined polynomial module for non-linear compensation.

15. The RF communication system of claim 11, wherein the remote impairments compensation module is further configured to:
 receive an input signal;
 split the input signal into wideband frequency components and narrowband frequency components;
 detect narrowband signals in the narrowband frequency components;
 detect wideband signals in the wideband frequency components; and
 analyze the detected narrowband and wideband signals to identify spurious signals in the RF communication system.

16. A method of identifying spurious signals in a radio frequency ("RF") communication system c communication system, the method comprising:
 receiving an input signal;
 splitting the input signal into wideband frequency components and narrowband frequency components;
 detecting narrowband signals in the narrowband frequency components;
 detecting wideband signals in the wideband frequency components; and
 analyzing the detected narrowband and wideband signals to identify spurious signals in the RF communication system.

17. A radio transmitter comprising:
 a radio frequency ("RF") power amplifier, the RF power amplifier including an input to receive an RF signal for transmission and being configured to amplify the RF signal for transmission across a communication channel;
 a modulator;
 an integrative software radio frequency management module having an input coupled to the output of the modulator and an output coupled to the RF power amplifier, the integrative software radio frequency management module configured to compensate for nonlinearity of the RF communication module by operating on the RF signal entering the amplifier;
 a second modulator; and
 an RF coupler having a first input coupled to the first modulator and a second input coupled to the second modulator and an output coupled to the input of the integrative software radio frequency management module.

18. The radio transmitter of claim 17, wherein the integrative software radio frequency management system comprises an RF digital pre- or post-distortion module.

19. The radio transmitter of claim 18, wherein the RF digital pre- or post-distortion module comprises:
 a parallel pipelined polynomial module for non-linear compensation; and
 an automated polynomial coefficient optimizer configured to adjust coefficients applied by the parallel pipelined polynomial module based on changes in the nonlinear response of the RF communication system.

20. The radio transmitter of claim 18, wherein the RF digital pre- or post-distortion module is configured to generate an inverse RF signal of the nonlinearity based on a mathematical model of the nonlinear response of the RF communication system, and to apply the inverse RF signal to the input signal of the power amplifier to cancel out some or all of the nonlinearity of the RF communication system.

21. The radio transmitter of claim 18, wherein the RF digital pre- or post-distortion module comprises: an analog-to-digital converter including an input coupled to receive input information signal, and an output coupled to a parallel pipelined polynomial module; and a digital-to-analog converter including an input coupled to an output of the parallel pipelined polynomial module and an output coupled to the RF power amplifier.

22. A radio transmitter comprising:
a modulator including an input coupled to receive an information signal and an output, the modulator configured to up convert the information signal to an RF information signal;
a radio frequency ("RF") digital predistortion module including an input coupled to receive the RF information signal and an output, the RF digital predistortion module configured to compensate for nonlinearity of the radio transmitter communication system by operating on the RF information signal; and
an RF power amplifier including an input coupled to the output of the RF digital predistortion module;
wherein the RF digital predistortion module comprises:
a parallel pipelined polynomial module for non-linear compensation; and
an automated polynomial coefficient optimizer configured to adjust coefficients applied by the parallel pipelined polynomial module based on changes in the nonlinear response of the RF communication system.

23. The radio transmitter of claim 22, wherein the RF digital predistortion module is configured to generate an inverse RF signal of the nonlinearity based on a mathematical model of the nonlinear response of the RF communication system, and to apply the inverse RF signal to the input signal of the power amplifier to cancel out some or all of the nonlinearity of the RF power amplifier.

24. The radio transmitter of claim 22, wherein the RF digital predistortion module comprises: an analog-to-digital converter including an input coupled to receive input information signal, and an output coupled to a parallel pipelined polynomial module; and a digital-to-analog converter including an input coupled to an output of the parallel pipelined polynomial module and an output coupled to the RF power amplifier.

25. The radio transmitter of claim 22, wherein the automated polynomial coefficient optimizer is further configured to:
determine frequencies of nonlinear signals to which the optimization will be applied, the determination based on a known frequency or frequencies of one or more dominant components of the input signal;
assign an initial range into which coefficients of the polynomial are expected to fall;
acquire a sample of an output data signal of the power amplifier;
apply a Fast Fourier Transform (FFT) to the acquired data sample to obtain a frequency domain representation of the data sample;
construct a figure of merit from a spectral power and all of the frequencies associated with nonlinear signals to be reduced;
bundle the figure of merit with the polynomial coefficients to create bundled parameters, and add the bundled parameters to an array;
sort the array according to the figure of merit;
crop the array if it exceeds a predetermined size;
reset the range by identifying maximum and minimum values of each coefficient within the array and define new range limits for each coefficient as these maximum and minimum values;
select a next set of coefficients from within this new allowed range of values;
identify a first set of optimized coefficients as those associated with the array element with the highest figure of merit; and
apply this first set of optimized coefficients to the RF digital pre- or post-distortion module.

26. The radio transmitter of claim 25, wherein the automated polynomial coefficient optimizer is further configured to determine an updated power spectrum and figure of merit for operation with the first set of optimized coefficients and compute a new set of optimized coefficients using these values.

27. A communication transceiver comprising:
a low noise amplifier including an input coupled to receive an RF information signal from an antenna and an output;
a radio frequency ("RF") digital postdistortion module including an input coupled to receive the RF information signal and an output, the RF digital postdistortion module configured to compensate for nonlinearity of the communication transceiver communication system by operating on the received RF information signal; and
a downconverter including an input coupled to the output of the RF digital postdistortion module;
wherein the RF digital postdistortion module comprises:
a parallel pipelined polynomial module for non-linear compensation; and
an automated polynomial coefficient optimizer configured to adjust coefficients applied by the parallel pipelined polynomial module based on changes in the nonlinear response of the RF communication system.

28. The communication transceiver of claim 27, wherein the RF digital postdistortion module is configured to generate an inverse RF signal of the nonlinearity based on a mathematical model of the nonlinear response of the low noise amplifier, and to apply the inverse RF signal to an output signal of the low noise amplifier to cancel out some or all of the nonlinearity.

29. A wideband adaptive intelligent software-defined radio frequency ("RF") communication system comprising:
a radio transmitter comprising an RF power amplifier, the RF power amplifier including an input to receive an RF signal for transmission and being configured to amplify the RF signal for transmission across a communication channel; and
a RF digital pre- or post-distortion module configured to compensate for nonlinearity of the RF communication system by operating on the RF signal entering or exiting the amplifier, wherein the RF digital pre- or post-distortion module comprises:
a parallel pipelined polynomial module for non-linear compensation, comprising a plurality of sets of an integer number of polynomial operators, the polynomial operators comprising a combination of one or more adders and a multipliers arranged serially such that an integer number of polynomial coefficients are applied to a digital representation of the RF signal, one at a time, each occurring at a unique one of an integer number of clock cycles; and an automated polynomial coefficient optimizer configured to adjust polynomial coefficients applied by the parallel pipelined polynomial module based on changes in the nonlinear response of the RF communication system.

30. A radio transmitter comprising:
a radio frequency ("RF") power amplifier including an input and an output;
a first RF switch including an input coupled to receive an RF input signal and first and second outputs;
a second RF switch including an output coupled to the input of the power amplifier, a first input coupled to a first output of the first RF switch, and a second input;
a third RF switch including a first input coupled to the second output of the first RF switch, a second input, and an output;
a fourth RF switch including first and second inputs coupled to the output of the RF amplifier, and an output coupled to the second input of the third RF switch; and
an RF digital pre- or post-distortion module including an input coupled to the output of the third RF switch to receive the RF information signal and an output coupled to the second input of the second RF switch, the RF digital pre- or post-distortion module configured to compensate for nonlinearity of the radio transmitter communication system by operating on the RF information signal.

31. The radio transmitter of claim 30, further comprising a first gain block coupled between the second output of the first RF switch in the first input of the third RF switch and configured to adjust a signal level of the RF input signal at the input to the RF digital pre- or post-distortion module.

32. The radio transmitter of claim 31, wherein the first gain block comprises a programmable attenuator; and RF splitter coupled to the programmable attenuator and an amplifier coupled to an output of the RF splitter.

33. The radio transmitter of claim 30, further comprising a second gain block coupled between the output of the RF digital pre- or post-distortion module and the second input of the second RF switch and configured to adjust a signal level of a predistorted RF signal output by the RF digital pre- or post-distortion module.

34. The radio transmitter of claim 30, further comprising a gain block coupled between the output of the RF power amplifier and the second input of the third RF switch and configured to adjust a signal level of the RF input signal at the input to the RF digital pre- or post-distortion module.

35. The radio transmitter of claim 30, wherein the RF digital pre- or post-distortion module comprises:
a parallel pipelined polynomial module for non-linear compensation; and
an automated polynomial coefficient optimizer configured to adjust coefficients applied by the parallel pipelined polynomial module based on changes in the nonlinear response of the RF communication system.

36. The radio transmitter of claim 30, wherein the RF digital pre- or post-distortion module is configured to generate an inverse RF signal of the nonlinearity based on a mathematical model of the nonlinear response of the RF communication system, and to apply the inverse RF signal to the input signal of the power amplifier to cancel out some or all of the nonlinearity of the RF communication system.

37. A radio frequency ("RF") communication system comprising:
a radio receiver comprising a low noise amplifier, the low noise amplifier including an input to receive a received RF signal;
a RF postdistortion module coupled to the radio receiver and configured to compensate for nonlinearity of the low noise amplifier and to generate an RF postdistortion signal;
a Fast Fourier Transform module having an input coupled to receive the RF post-distortion signal configured to determine a power spectrum of the bandwidth of the RF communication system;
a signal identification module coupled to the Fast Fourier Transform module and configured to identify remote signals to which nonlinear compensation is applied; and
a frequency assignment module configured to determine a frequency for transmit and receive channels of the RF communication system.

38. The RF communication system of claim 37, further comprising an RF power amplifier, the RF power amplifier including an input to receive an RF signal for transmission and being configured to amplify the RF signal for transmission across a communication channel and a RF predistortion module configured to compensate for nonlinearity of the RF power amplifier by operating on the RF signal entering amplifier.

* * * * *